United States Patent
Inoue

(10) Patent No.: US 9,158,210 B2
(45) Date of Patent: Oct. 13, 2015

(54) WORK STAGE OF EXPOSING APPARATUS, EXPOSING METHOD AND METHOD OF MANUFACTURING A STRUCTURE

(71) Applicant: Eriko Inoue, Shinjuku-ku (JP)

(72) Inventor: Eriko Inoue, Shinjuku-ku (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 220 days.

(21) Appl. No.: 13/768,176

(22) Filed: Feb. 15, 2013

(65) Prior Publication Data

US 2013/0155382 A1    Jun. 20, 2013

Related U.S. Application Data

(63) Continuation of application No. 12/528,560, filed as application No. PCT/JP2008/052106 on Feb. 8, 2008, now abandoned.

(30) Foreign Application Priority Data

Feb. 26, 2007  (JP) .................................. 2007-045654

(51) Int. Cl.
   *G03F 7/20*  (2006.01)
   *G03F 9/00*  (2006.01)

(52) U.S. Cl.
   CPC .............. *G03F 7/707* (2013.01); *G03F 7/7035* (2013.01); *G03F 7/70425* (2013.01); *G03F 7/70783* (2013.01); *G03F 9/7003* (2013.01); *G03F 9/7038* (2013.01)

(58) Field of Classification Search
   CPC . G03F 7/707; G03F 7/70716; G03F 7/70783; G03F 7/2014; G03F 7/7035; G03F 7/70691
   USPC .............................................. 355/72
   See application file for complete search history.

(56) References Cited

U.S. PATENT DOCUMENTS 3,955,163 A  5/1976 Novak
4,218,136 A  8/1980 Komoriya et al.
(Continued)

FOREIGN PATENT DOCUMENTS

JP    62-76530 U    5/1987
JP    4-357820 A    12/1992
(Continued)

*Primary Examiner* — Steven H Whitesell Gordon
(74) *Attorney, Agent, or Firm* — Sughrue Mion, PLLC

(57) ABSTRACT

At a time of aligning a thin plate-shaped work of which both front and rear surfaces are subjected to work, a deflection caused at a central portion of the thin plate-shaped work is corrected and the thin plate-shaped work is controlled to be parallel state with respect to a photomask.

The present invention provides an exposing method comprising: a supporting step in which a peripheral portion 6b of a thin plate-shaped work 6 of which both front and rear surfaces are subjected to work is supported by a supporting portion 7 of a work stage 9 provided to a exposing apparatus; a deflection correcting step in which a fluid is introduced into a hollow portion 8 formed to an inside the supporting portion 7, so that a deflection caused at a central portion 6a of the thin plate-shaped work 6 supported by the supporting portion 7 is corrected; an aligning step in which positions of the thin plate-shaped work 6 of which peripheral portion 6b is supported by the supporting portion 7 and a photomask 3 are adjusted; and an exposing step in which the thin plate-shaped work 6 is exposed with light irradiated from upper side of the photomask 3.

5 Claims, 12 Drawing Sheets

(56) References Cited

U.S. PATENT DOCUMENTS

| | | |
|---|---|---|
| 4,576,475 A | 3/1986 | Kitagawa et al. |
| 4,737,824 A | 4/1988 | Sakai et al. |
| 4,984,017 A | 1/1991 | Nishida et al. |
| 6,232,023 B1 * | 5/2001 | Matsuki et al. ............... 430/22 |
| 6,459,474 B1 | 10/2002 | Okada |
| 2003/0095244 A1 * | 5/2003 | Komatsu ...................... 355/72 |
| 2004/0036850 A1 * | 2/2004 | Tsukamoto et al. ............ 355/72 |

FOREIGN PATENT DOCUMENTS

| | | |
|---|---|---|
| JP | 3362653 B2 | 1/2003 |
| JP | 2004-061280 A | 2/2004 |
| JP | 2007-036101 A | 2/2007 |

* cited by examiner

WORK STAGE OF EXPOSING APPARATUS, EXPOSING METHOD AND METHOD OF MANUFACTURING A STRUCTURE

CROSS-REFERENCE TO RELATED APPLICATIONS

This is a continuation of U.S. patent application Ser. No. 12/528,560, filed on Aug. 25, 2009, which is a 371 of PCT Application No. PCT/JP2008/052106 filed Aug. 2, 2008, which claims priority from Japanese Patent Application No. 2007-045654 filed Feb. 6, 2007, all of which applications are incorporated herein by references.

TECHNICAL FIELD

The present invention relates to a work stage of an exposing apparatus which is used for exposing patterns on a thin plate-shaped work composed of semiconductor, glass, plastics or the like, and also relates to an exposing method using the work stage and a method of manufacturing a structure using the thin plate-shaped work.

BACKGROUND ART

Generally, when a photo resist is coated on a surface of a thin plate-shaped work and an exposing operation is performed by utilizing a contact aligner, after a photomask is held and fixed by a mask holder which is disposed at upper portion of a work stage, then, the thin plate-shaped work is held and fixed on the work stage by vacuum sucking (vacuum absorption) thereby to adjust an alignment of the work. Thereafter, the exposing operation is performed. In this connection, in order to vacuum-suck the thin plate-shaped work on the work stage, a vacuum sucking hole is provided at an arbitral position on the work stage, and an entire rear surface of the thin plate-shaped work is contacted to the work stage, so that the thin plate-shaped work is held in a horizontal state.

However, as disclosed in a Patent Document 1, in a conventional exposing step of a thin plate-shaped work of which both sides are to be worked, for the purpose of preventing contamination and damage of the entire rear surface of the thin plate-shaped work, it is not possible to contact the entire rear surface of the thin plate-shaped work to the work stage. Therefore, it is necessary to hold and fix the thin plate-shaped work at only a projected mounting portion provided to the peripheral portion of the thin plate-shaped work. Accordingly, there has been generally adopted a method in which the thin plate-shaped work is held and fixed by vacuum-sucking at a vacuum sucking hole formed in the projected mounting portion which is provided to the peripheral portion of the thin plate-shaped work.

Further, in case of the thin plate-shaped work of which both sides are to be worked, it is necessary to perform a both-side alignment in which a mask pattern and a pattern of rear surface of the thin plate-shaped work are aligned in addition to a single sided alignment in which the mask pattern and a pattern of front surface of the thin plate-shaped work are aligned, this single sided alignment being usually performed in the single sided work. In the above single side alignment, there has been normally used a method in which the mask pattern and the a work pattern are simultaneously observed by means of a microscope provided to an upper portion of the work stage, and a pattern adjusting is performed by moving the thin plate-shaped work. Furthermore, in the above double sides alignment, there has been generally adopted a method in which firstly only the photomask is contacted on the work stage by means of a microscope provided to a lower portion of the work stage whereby a position of the mask pattern is memorized and stored by the microscope. Thereafter, the photomask is raised without moving the microscope, and the thin plate-shaped work is held and fixed on the work stage, then the pattern of the thin plate-shaped work and a memorized pattern of the photomask are adjusted.

Further, in an exposing step after the aligning step, the following three kinds of exposing methods are mainly adopted. Namely, there have been used: a proximity exposing method in which a gap (proximity gap) is provided between the photomask and the thin plate-shaped work, and the exposing operation is performed in this state; a soft contact exposing method in which an exposing operation is performed in a state where the mask holder and the work stage are mechanically contacted to each other; and a hard contact exposing method (for example, see Patent Document 2) in which an exposing operation is performed in a state where a close contacting property between the photomask and the thin plate-shaped work is enhanced by a force of vacuum or fluid or the like from the soft contact state. As one example of this hard contact exposing method, there is a method in which a fluid is introduced from the vacuum suction hole provided to the peripheral portion of the work or the fluid is introduced from a central portion of the thin plate-shaped work thereby to enhance the close-contacting property between the thin plate shaped-work and the photomask.

Patent Document 1: Japanese Patent Provisional No. 2004-61280
Patent Document 2: Japanese Patent No. 3362653

DISCLOSURE OF THE INVENTION

Problems to be Solved by the Invention

In the method of holding and fixing the work described in the above background art, when the aligning operation is performed under a state where the thin plate-shaped work is held and fixed, a deflection (distortion) is liable to occur at a central portion of the thin plate-shaped work, so that a horizontal state of entire thin plate-shaped work cannot be maintained. As a result, a distance between the photomask and the thin plate-shaped work is changed in accordance with a position in the thin plate-shaped work, and the distance is different from a set value. Therefore, there has been posed a problem that the aligning operation cannot be accurately performed.

In case of the single side alignment, the deflection is occurred at central portion of the thin plate-shaped work at the time of the alignment. In contrast, at a time of the hard contact exposing operation, the thin plate-shaped work is closely contacted to the photomask, so that the work is maintained in a state free from the deflection. Therefore, the accuracy in alignment of the former case is inferior to the latter case.

Further, in case of double side alignment, the photomask held and fixed by the mask holder using a vacuum-sucking function has a thickness of several millimeters, so that the photomask hardly occur the deflection. In contrast, the thin plate-shaped work has a thickness of several 100 s μm to 1 mm and only the peripheral portion of the work is held and fixed by the vacuum-sucking function, so that the deflection is disadvantageously occurred. Therefore, at a position (Z-axial direction) of a microscope which focuses clearly on the photomask, the thin plate shaped-work is out of focus, so that there has been posed a problem that an accurate alignment cannot be performed.

On the other hand, at the time of the above proximity exposing operation or the soft contact exposing operation, when the means for solving the problems similar to those of the alignment are applied, the exposing operation can be performed under a state where the thin plate-shaped work is maintained to be parallel with respect to the photomask.

However, in a case of the hard contact exposing operation where the exposing operation is performed using the method explained in the background art, if the pressures of the introducing fluid at the aligning step and at the exposing step are not changed, there may be a case where the parallel state of the thin plate shaped-work with respect to the photomask cannot be maintained at the exposing step. Accordingly, if the parallel state of the thin plate shaped-work with respect to the photomask is not maintained at the exposing step, there arises a problem such that a difference in patterning shape would occurs in-plain of the thin plate shaped-work.

The present invention had been achieved to solve the aforementioned problems, and an object of the present invention is to provide a work stage of exposing apparatus, an exposing method using the work stage and a method of manufacturing a structure using the thin plate-shaped work, which is capable of correcting a deflection caused at central portion of the thin plate shaped-work when the thin plate shaped-work of which both sides are subjected to work is aligned, and which is capable of performing an aligning operation under a state where the thin plate shaped-work is maintained to be parallel with the photomask.

Further, another object of the present invention is to provide a work stage of exposing apparatus, an exposing method using the work stage and a method of manufacturing a structure using the thin plate-shaped work, in which a fluid pressure at the aligning step and a fluid pressure at the exposing step are set to be changeable, and the aligning step and the exposing step can be performed under a state where the thin plate shaped-work maintained to be parallel with the photomask at both the aligning step and the exposing step.

Means for Solving the Problems

In order to solve the aforementioned problems, the present invention has adopted the following structures.

Accordingly, the present invention specified in claim 1 provides an exposing method comprising: a supporting step in which a peripheral portion 6*b* of a thin plate-shaped work 6 of which both front and rear surfaces are subjected to work is supported by a supporting portion 7 of a work stage 9 provided to a exposing apparatus; a deflection correcting step in which a fluid is introduced into a hollow portion 8 formed to an inside the supporting portion 7, so that a deflection caused at a central portion 6*a* of the thin plate-shaped work 6 supported by the supporting portion 7 is corrected; an aligning step in which a position of the thin plate-shaped work 6 of which peripheral portion 6*b* is supported by the supporting portion 7 and a position of photomask 3 are adjusted; and an exposing step in which the thin plate-shaped work 6 is exposed with light irradiated from upper side of the photomask 3.

The invention specified in claim 2 provides the exposing method according to claim 1, wherein the method further comprises a contacting step in which the thin plate-shaped work 6 is closely contacted to the photomask while the deflection of the thin plate-shaped work is corrected by introducing the fluid into the hollow portion 8 prior to the exposing step.

The invention specified in claim 3 provides the exposing method according to claim 2, wherein a pressure of the fluid in the contacting step is set to be higher than that of in the deflection correcting step.

The invention specified in claim 4 provides the exposing method according to any one of claims 1 to 3, wherein the supporting step is performed such that the peripheral portion 6*b* of the thin plate-shaped work 6 is sucked to the supporting portion 7 by a vacuum-sucking device thereby to support the peripheral portion 6*b*.

The invention specified in claim 5 provides the exposing method according to any one of claims 1 to 4, wherein the deflection caused at the central portion 6*a* of the thin plate-shaped work 6 is corrected by flowing the fluid between inside and outside of the hollow portion 8.

An invention specified in claim 6 provides a method of manufacturing a structure in which the structure is manufactured by using the thin plate-shaped work which is exposed with light in accordance with the exposing method according to any one of claims 1 to 5.

An invention specified in claim 7 provides a work stage of an exposing apparatus, comprising: a supporting portion 7 for supporting a peripheral portion 6*b* of a thin plate-shaped work 6 of which both front and rear surfaces are subjected to work; and a hollow portion 8 formed under the thin plate-shaped work 6 at inside of the supporting portion 7; wherein the work stage comprises: a deflection correcting device for correcting a deflection caused at a central portion of the thin plate-shaped work 6 by introducing a fluid into the hollow portion 8; and at least two fluid introducing systems 23*a*, 23*b* each introducing the fluid having a different pressure to each other into the hollow portion 8; and opening/closing devices 24*a*, 24*b* provided to the respective fluid introducing systems 23*a*, 23*b*; said fluid introducing systems 23*a*, 23*b* are configured such that: i) a fluid pressure at a time of an alignment operation in which a position of the thin plate-shaped work 6 of which peripheral portion 6*b* is supported by the supporting portion 7 and a position of the photomask 3 are adjusted; and ii) a fluid pressure at a time of an exposing operation in which the thin plate-shaped work 6 is closely contacted to the photomask 3; are set to be changeable by switching the opening/closing devices 24*a*, 24*b* provided to the respective fluid introducing systems 23*a*, 23*b*.

The invention specified in claim 8 provides the work stage of the exposing apparatus according to claim 7, wherein the opening/closing devices 24*a*, 24*b* are controlled by a control device 30 so as to automatically switch the opening/closing devices 24*a*, 24*b*.

The invention specified in claim 9 provides the work stage of the exposing apparatus according to claim 7 or 8, wherein the work stage further comprises a base portion 9*b* formed with an introducing hole 13 for introducing the fluid into the hollow portion 8 and a discharging hole 35 for discharging the fluid to outside of the hollow portion 8.

The invention specified in claim 10 provides the work stage of the exposing apparatus according to any one of claims 7 to 9, wherein the work stage further comprises a vacuum sucking device for sucking the peripheral portion 6*b* of the thin plate-shaped work 6 to the supporting portion 7 at a time of alignment operation.

Effects of the Invention

According to the present invention specified in claim 1, the exposing method comprises: the deflection correcting step in which the fluid is introduced into the hollow portion 8 formed to the inside the supporting portion 7, so that the deflection caused at the central portion 6*a* of the thin plate-shaped work 6 supported by the supporting portion 7 is corrected; the aligning step in which the position of the thin plate-shaped work 6 of which peripheral portion 6*b* is supported by the supporting portion 7 and the position of photomask 3 are adjusted; and an exposing step in which the thin plate-shaped work 6 is exposed with light irradiated from upper side of the photomask 3. Therefore, when the work is aligned and both front and rear surfaces of the work 6 are subjected to work, the thin plate-shaped work 6 is supported by the supporting portion at only the peripheral portion 6b of the work 6, so that a rear surface of the thin plate-shaped work 6 would not be contaminated or damaged. In addition, a parallel state of the thin plate-shaped work 6 with respect to the photomask 3 is sufficiently maintained, so that the accuracy in alignment and the exposing operation can be greatly improved, whereby a production yield can be also increased.

Further, even in a case where either one of exposing systems of the proximity exposing system or the soft contact exposing system is adopted, the exposing operation can be performed while maintaining a parallel state of the thin plate shaped-work 6 with respect to the photomask 3.

According to the present invention specified in claim 2, the exposing method is configured in addition to the method according to claim 1 so as to further comprise a contacting step in which the thin plate-shaped work 6 is closely contacted to the photomask 3 while the deflection of the thin plate-shaped work 6 is corrected by introducing the fluid into the hollow portion 8 prior to the exposing step. Therefore, at the aligning step in accordance with the hard contact exposing method, the thin plate-shaped work 6 can be maintained in parallel with the photomask 3, so that the accuracy in alignment can be improved. In this case, the work stage 9 is in non-contacted state with respect to the rear surface of the thin plate-shaped work 6, so that it becomes possible to prevent the rear surface of the thin plate shaped-work from being contaminated and damaged.

According to the invention specified in claim 3, the exposing method is configured in addition to the method according to claim 2 so that a pressure of the fluid in the contacting step is set to be higher than that of in the deflection correcting step. Therefore, at the hard contact exposing operation, an entire surface of the thin plate-shaped work 6 is closely contacted to the photomask 3 with a uniform pressing force. Accordingly, it becomes possible to maintain the parallel state of the thin plate shaped-work 6 with respect to the photomask 3 in both the aligning step and the exposing step, so that the accuracy in alignment and exposing operation can be improved, and uniformity in in-plane distribution of pattern shape can be also improved. In this case, the work stage 9 is in non-contacted state with respect to the rear surface of the thin plate-shaped work 6, so that it becomes possible to prevent the rear surface of the thin plate shaped-work 6 from being contaminated and damaged.

According to the invention specified in claim 4, the exposing method is configured in addition to the method according to any one of claims 1 to 3 so that the supporting step is performed such that the peripheral portion 6b of the thin plate-shaped work 6 is sucked to the supporting portion 7 by a vacuum sucking device thereby to support the peripheral portion. Therefore, the thin plate-shaped work 6 can be easily and firmly fixed to the supporting portion 7 at the aligning step, so that a positioning operation of the thin plate-shaped work 6 and the photomask 3 can be performed with more accurately.

According to the invention specified in claim 5, the exposing method is configured in addition to the method according to any one of claims 1 to 4 so that the deflection caused at the central portion 6a of the thin plate-shaped work 6 is corrected by flowing the fluid between inside and outside of the hollow portion 8. Therefore, the parallel state of the thin plate-shaped work 6 with respect to the photomask 3 can be effectively maintained while preventing a rapid rising of the fluid pressure.

According to the invention specified in claim 6, the structure is manufactured by using the thin plate-shaped work which is exposed with light in accordance with the exposing method according to any one of claims 1 to 5. Therefore, the deflection of the work is corrected at the aligning step, so that the accuracy in alignment can be improved, and the deflection is corrected at the exposing step, so that a pattern resolution can be also improved.

According to the invention specified in claim 7, the work stage of an exposing apparatus comprises: the deflection correcting device for correcting a deflection caused at a central portion of the thin plate-shaped work 6 by introducing a fluid into the hollow portion 8; at least two fluid introducing systems 23a, 23b each introducing the fluid having a different pressure to each other into the hollow portion 8; and opening/closing devices 24a, 24b provided to the respective fluid introducing systems 23a, 23b; the fluid introducing systems 23a, 23b are configured such that: i) a fluid pressure at a time of an alignment operation in which position of the thin plate-shaped work 6 of which peripheral portion 6b is supported by the supporting portion 7 and position of the photomask 3 are adjusted; and ii) a fluid pressure at a time of an exposing operation in which the thin plate-shaped work 6 is closely contacted to the photomask 3; are set to be changeable by switching the opening/closing devices 24a, 24b provided to the respective fluid introducing systems 23a, 23b. Therefore, it becomes possible to maintain the parallel state of the thin plate shaped-work 6 with respect to the photomask 3 in both the aligning step and the exposing step, so that the accuracy in alignment and exposing operation can be improved, and the uniformity in in-plane distribution of pattern shape can be also improved. As a result, a production yield can be also increased.

According to the invention specified in claim 8, the work stage is configured in addition to the work stage according to claim 7 so that the opening/closing devices 24a, 24b are controlled by a control unit 30 so as to automatically switch the opening/closing devices 24a, 24b. Therefore, the fluid pressure at the aligning step and the exposing step can be automatically switched and changed.

According to the invention specified in claim 9, the work stage is configured in addition to the work stage according to claim 7 or 8 so that the work stage further comprises an introducing hole 13 for introducing the fluid into the hollow portion 8 and a discharging hole 35 for discharging the fluid to outside of the hollow portion 8 whereby the deflection caused at a central portion 6a of the thin plate shaped-work 6 is corrected. Therefore, it becomes possible to prevent a rapid rising of the fluid pressure.

According to the invention specified in claim 10, the work stage of the exposing apparatus is configured in addition to the work stage according to any one of claims 7 to 9 so that the work stage further comprises a vacuum sucking device for sucking the peripheral portion 6b of the thin plate-shaped work 6 to the supporting portion 7 at a time of alignment operation. Therefore, the thin plate-shaped work 6 can be easily and firmly fixed to the supporting portion 7 at the aligning step, so that a positioning operation of the thin plate-shaped work 6 and the photomask 3 can be performed with a higher accuracy.

BRIEF DESCRIPTION OF THE DRAWINGS

FIG. 12 is a perspective view showing an acceleration sensor to which the embodiment of the present invention is applied.

EXPLANATION OF REFERENCE NUMERALS

Figure 1:
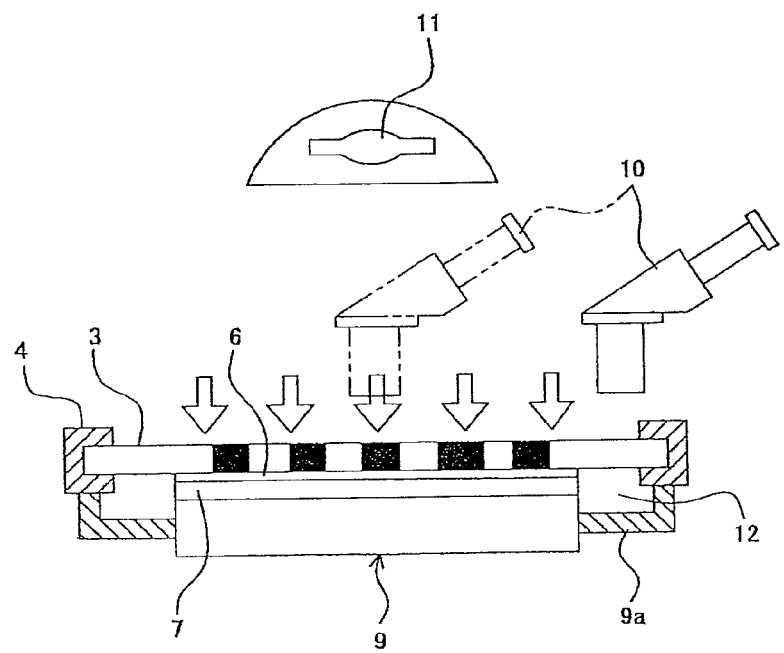
FIG. 1 is a front view showing an outline of an exposing apparatus used in the present invention.

3 . . . photomask
6 . . . thin plate shaped-work
6a . . . central portion of the thin plate shaped-work
6b . . . peripheral portion of the thin plate shaped-work
7 . . . supporting portion
8 . . . hollowed portion
13 . . . introducing hole
19 . . . blower
20 . . . vacuum pump
23a, 23b . . . branch hose
24a, 24b . . . solenoid valve
27 . . . blower
30 . . . control unit
35 . . . discharging hole
50 . . . acceleration sensor
51 . . . SOI substrate
52 . . . glass substrate
53 . . . active layer (first layer)
53a . . . displaced portion
53b . . . connecting portion
53c . . . fixing portion
53d . . . opening portion
54 . . . BOX layer (second layer)
54a . . . bonding portion
55 . . . supporting layer (third layer)
55a . . . weight portion
55b . . . frame portion
61 . . . diffusing portion
62 . . . insulating layer
63 . . . contact hole
64 . . . interlaminar connecting member
65 . . . wiring
66 . . . protective film
67 . . . pad opening
Rx1-Rx4, Ry1-Ry4, Rz1-Rz4 . . . piezo resistor

BEST MODE FOR CARRYING OUT THE INVENTION

Hereunder, a best mode for carrying out the present invention will be described with reference to the accompanying drawings.

<First Embodiment>

As shown in FIG. 1, an exposing apparatus used in the present embodiment comprises: a work stage 9 for holding a thin plate shaped-work 6; a mask holder 4 for holding a photomask 3 on which predetermined pattern is formed; a microscope 10 for use in alignment process; and a high-pressure mercury lamp 11 as a light source for the exposing operation.

The thin plate shaped-work 6 is, for example, a silicon wafer which is a raw material for constituting an acceleration sensor, and a predetermined work is performed to both front and rear surfaces of the work. The silicon wafer used in the present embodiment has a thickness of about several 100 s μm to 1 mm, and the silicon wafer has a thin circular disk shape having a diameter of several cm to about 20 cm. On the front surface of the thin plate shaped-work 6 is formed with a resist film (not shown) prior to the exposing step. This thin plate shaped-work 6 is disposed within the exposing apparatus in a state of being horizontally held on the work stage 9.

The photomask 3 is a transparent glass plate formed with pattern which is to be transferred to a resist film of the thin plate shaped-work 6. Further, the photomask 3 is disposed within the exposing apparatus in a state of being held by the mask holder 4 at peripheral portion of the photomask 3. The work stage 9 and the mask holder 4 are relatively movable so as to approach to each other or to apart from the other. For example, when the work stage 9 is moved upward, the thin plate shaped-work 6 is contacted to the photomask 3 which is in a state of rest as shown in FIG. 1. While, when the work stage 9 is moved downward, the thin plate shaped-work 6 moves to apart from the photomask 3.

The work stage 9 is provided with an extended portion 9a as occasion demands. When this extended portion 9a is abut against the mask holder 4, there is formed a vacuum chamber 12 which encircles a contacted portion of the thin plate shaped work 6 and the photomask 3. Further, when air is discharged from the vacuum chamber 12, an adhesion property (close-contacting property) between the thin plate shaped-work 6 and the photomask 3 can be increased.

The microscope 10 is used for aligning operation for the thin plate shaped-work 6 and the photomask 3. At a position indicated by double-dotted line shown in FIG. 1, an operator observes an alignment mark through the microscope 10. In this state, the operator performs a positioning (adjusting) operation of the thin plate shaped-work 6 and the photomask 3. After completion of the positioning operation, the microscope 10 is retracted to a position indicated by a solid line in FIG. 1.

The mercury lamp 11 is configured to irradiate a light from a side of the photomask 3 as indicated by an arrow to a laminated body composed of the thin plate shaped-work 6 and the photomask 3 of which aligning operation has been completed. Due to this operation, a pattern of the photomask 3 is exposed the resist film of the thin plate shaped-work 6. Thus exposed thin plate shaped-work 6 is then subjected to a developing treatment thereby to form the pattern on the resist film.

Figure 2:
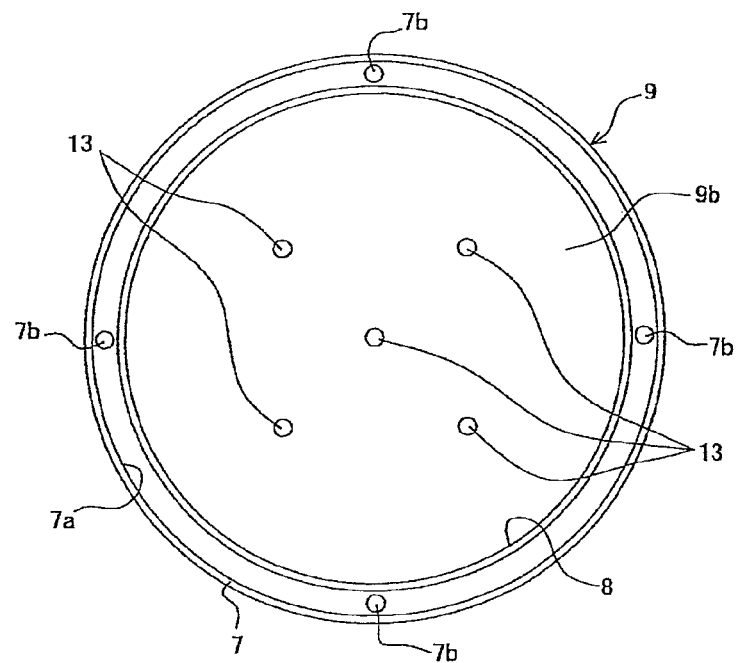
FIG. 2 is a plan view showing a work stage according to a first embodiment used in the exposing apparatus shown in FIG. 1.
Figure 3:
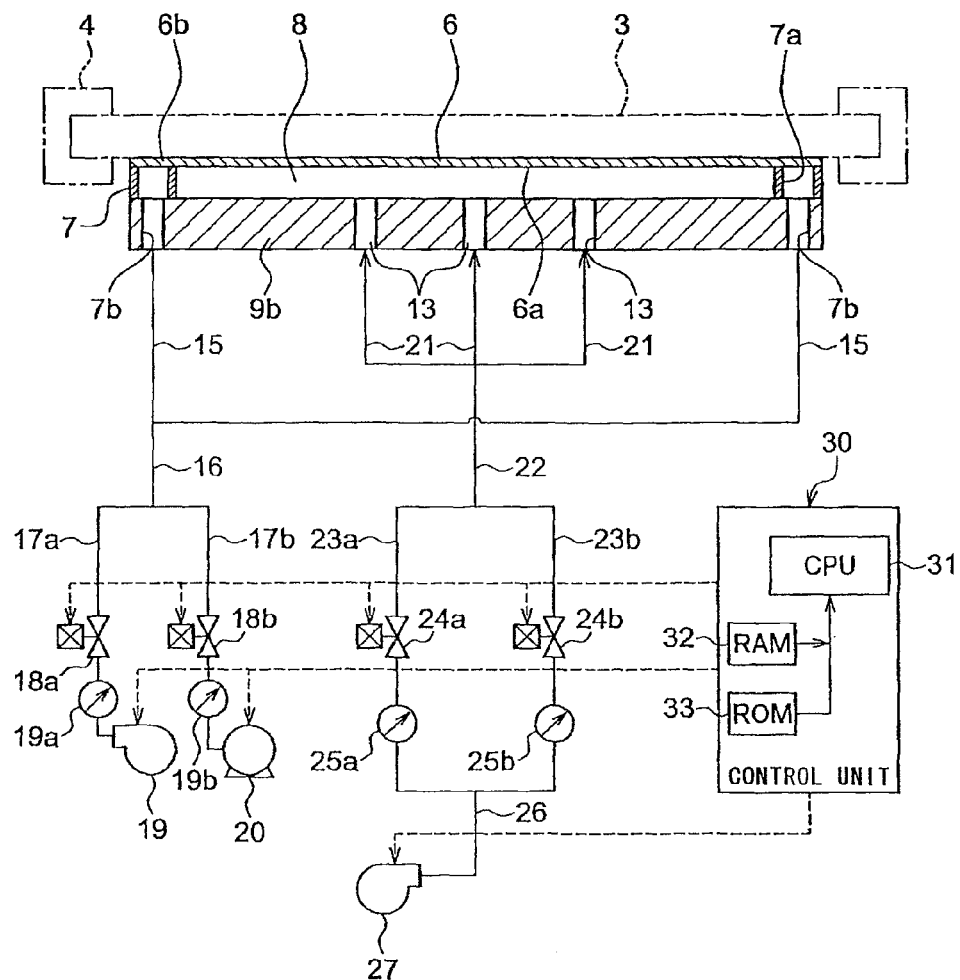
FIG. 3 is a system diagram of a deflection correcting device of the work stage shown in FIG. 2.

As shown in FIGS. 2 and 3, the work stage 9 is configured so as to comprise; a supporting portion 7 for supporting a peripheral portion 6b of a thin plate-shaped work 6 of which both front and rear surfaces are subjected to work; a hollow portion 8 formed under the thin plate-shaped work 6 at inside of the supporting portion 7 so that the thin plate shaped-work 6 supported by the supporting portion 7 is configured so as to approach or contact to the photomask 3; and a deflection correcting device for correcting a deflection caused at a central portion 6a of the thin plate-shaped work 6 of which peripheral portion 6b is supported by the supporting portion 7.

As shown in FIG. 2, the work stage 9 comprises a base portion 9b having a circular disc shape, and the supporting portion 7 is formed at outer peripheral portion of an upper surface of this base portion 9b. This supporting portion 7 is formed as an annular projection which accords with the peripheral portion 6b of the thin plate shaped-work 6. Further, this work stage 9 also comprises a vacuum sucking device for sucking the peripheral portion 6b of the thin plate shaped-work 6 to the supporting portion 7.

This vacuum sucking device comprises: an annular concave groove 7a formed along the supporting portion 7; a vacuum sucking hole 7b formed to a groove bottom of the annular concave groove 7a; and a vacuum pump, as described later, which is connected to the vacuum sucking hole 7b through a connecting hose. When this vacuum pump is driven and air in the annular concave groove 7a is discharged from the vacuum sucking hole 7b, the peripheral portion 6b of the thin plate shaped-work 6 is sucked and fixed to the annular concave groove 7a of the supporting portion 7.

The follow portion 8 is formed by an inner peripheral portion of the annular projection and the upper surface of the base portion 9b. Due to existence of this hollow portion 8, a contact of the rear surface (lower surface) of the thin plate shaped-work 6 supported by the supporting portion 7 to the work stage 9 is avoided, whereby a damage of the rear surface of the thin plate shaped-work 6 can be effectively prevented.

The deflection correcting device concretely utilizes a pressure of a fluid supplied into the hollow portion 8. This fluid may be a liquid such as water or the like. However, in the present embodiment, gas such as nitrogen gas or the like, preferably air is used. As the air, a clean air from which dust or the like has been removed is used. The base portion 9b of the work stage 9 is formed with a plurality of introducing holes 13 for introducing air into the hollow portion 8. These introducing holes 13 are connected to a blower, as described later, through connecting hoses. Accordingly, the above deflection correcting device comprises the blower, the introducing holes 13 and the above connecting hoses.

Next, the above vacuum sucking device and the deflection correcting device will be explained with reference to FIG. 3.

As shown in FIG. 3, the plurality of vacuum suction holes 7b formed in the work stage 9 are connected to the connecting hoses 15, and these connecting hoses 15 are connected to one junction hose 16. This junction hose 16 is branched into branch hoses 17a, 17b constituting two systems. A blower 19 and a vacuum pump 20 are respectively connected to these branch hoses 17a, 17b through solenoid valves 18a, 18b as switching devices (opening/closing devices) and through regulators 19a, 19b for controlling air pressure.

Accordingly, at the aligning step, when the solenoid valves 18b is opened and the vacuum pump 20 is driven, the air in the annular concave groove 7a is discharged from the vacuum suction hole 7b whereby the peripheral portion 6b of the thin plate shaped-work 6 is sucked and fixed to the annular concave groove 7a of the supporting portion 7. Further, at the time of exposing step in which the thin plate shaped-work 6 is closely contacted to the photomask 3 (hereinafter, referred to as "hard contact exposing operation"), when the solenoid valves 18a is opened and the blower 19 is driven, the air having a pressure of about 1.2 MPa is blown from the vacuum sucking hole 7b into the annular concave groove 7a.

Further, as shown in FIG. 3, the plurality of the introducing holes 13 formed to the work stage 9 are connected by connecting hoses 21, and these connecting hoses 21 are connected to one junction hose 22. This junction hose 22 is branched into two branch hoses 23a and 23b. These branch hoses 23a and 23b are connected to one junction hose 26 through solenoid valves 24a, 24b and regulators 25a, 25b for controlling air pressure. Further, this junction hose 26 is connected to a blower 27. The regulator 25a controls a pressure of the air supplied from the blower 27 to be about 1.0 MPa, while the regulator 25b controls a pressure of the air supplied from the blower 27 to be about 1.5 MPa.

Accordingly, in the aligning step, when the solenoid valves 24a is opened and the blower 27 is driven, the air having a pressure of about 1.0 MPa is introduced from the plurality of introducing holes 13 into the hollow portion 8, and the air is blown to a center portion 6a of the thin plate shaped-work 6 whereby the deflection of the thin plate shaped-work 6 is corrected and the thin plate shaped-work 6 becomes to be parallel with respect to the photomask 3.

Furthermore, at a time of the hard contact exposing operation, when the solenoid valves 18a is opened and the blower 19 is driven, the air having a pressure of about 1.2 MPa is introduced from the vacuum sucking holes 7b into the annular concave groove 7a, and the air is blown to a peripheral portion 6b of the thin plate shaped-work 6 whereby the thin plate shaped-work 6 is closely contacted to the photomask 3.

In addition, at a time of the hard contact exposing operation, when the solenoid valves 24b is opened and the blower 27 is driven, the air having a pressure of about 1.5 MPa is introduced into the hollow portion 8, and the air is blown to a central portion 6a of the thin plate shaped-work 6 whereby the deflection of the thin plate shaped-work 6 is corrected.

Opening/closing operation of the solenoid valves 18a, 18b and the solenoid valves 24a, 24b, and ON-OFF operations of the blower 19, the vacuum pump 20 and the blower 27 are controlled by a control unit 30 as a control device. The control unit 30 comprises: a CPU 31 for performing entire controls; a RAM 32; a RAM 32 functioning as a work area of this CPU 31 and having a function of memorizing calculation data on the way; and a ROM 33 which memorizes control program for controlling an entire of CPU 31.

Further, the CPU 31 comprises a position detecting circuit. At the time of the aligning operation, when a position sensor such as limit switch or the like detects that the position of the microscope 10 is moved to an observation position, the position sensor outputs an observation position signal and this signal is inputted to this position detecting circuit. In addition, after completion of the aligning operation, when the position sensor such as limit switch or the like detects that the position of the microscope 10 is moved to an evacuation position, the position sensor outputs an evacuation position signal and this signal is also inputted to this position detecting circuit.

Therefore, at the time of aligning operation, the CPU 31 controls the solenoid valves 18b, 24a to be opened, and controls the vacuum pump 20 and the blower 27 to be driven on the basis of the observation position signal inputted in the position detecting circuit.

In addition, when the evacuation position signal is inputted to the position detecting circuit, the CPU 31 controls the solenoid valve 24a to be closed, and controls a drive of the blower 27 to be stopped.

In this connection, the present embodiment is configured such that, for example, a starting and a completion of the aligning operation are detected on the basis of the position signal of the microscope 10. However, the present invention is not limited thereto. The starting and the completion of the aligning operation can be also detected by another detection unit.

Furthermore, the CPU 31 comprises a lamp-house shutter switching detector circuit. When a lamp-house shutter of the mercury lamp 11 which normally turns on is opened, a lamp-house shutter open signal is inputted to the lamp-house shutter switching detector circuit. On the other hand, when the lamp-house shutter of the mercury lamp 11 is closed, a lamp-house shutter close signal is inputted to the lamp-house shutter switching detector circuit.

Accordingly, the CPU 31 controls the solenoid valves 18a, 24b to be opened and controls the blowers 19, 27 to be driven on the basis of the lamp-house shutter open signal which is inputted when the hard contact exposing operation is started by irradiating the light of the mercury lamp 11 with respect to the thin plate shaped-work from an upper side of the photomask 3.

On the other hand, the CPU 31 controls the solenoid valves 18a, 24b to be closed and controls the blowers 19, 27 to be stopped on the basis of the lamp-house shutter close signal which is inputted when the hard contact exposing operation is completed.

Furthermore, in a case where the mask holder 4 is descended or the work stage 9 is up-risen, the CPU 31 controls the solenoid valve 18b to be closed and controls the drive of the vacuum pump 20 to be stopped on the basis of these position signals. In this connection, an exposing time of the mercury lamp 11 is set in advance, so that the mercury lamp 11 is configured such that the lamp-house shutter is closed when this predetermined time has passed.

In this connection, the present embodiment is configured such that, for example, the starting and the completion of the exposing operation are detected on the basis of the switching (opening/closing) signal of the lamp-house shutter. However, the present invention is not limited thereto. The starting and the completion of the exposing operation can be also detected by another detection unit.

Next, the aligning operation according to the present embodiment in which a positioning of the thin plate shaped-work 6 and the photomask 3 is performed will be explained with reference to the accompanying drawings of FIGS. 4 and 5.

(1) At the time of aligning operation, when the thin plate shaped-work 6 is set on the work stage 9 and the solenoid valve 18b is opened, then the vacuum pump 20 is driven, the air in the annular concave groove 7a is discharged from the vacuum sucking hole 7b of the work stage 9 thereby to form a vacuum state, so that the peripheral portion 6b of the thin plate shaped-work 6 is sucked and fixed to the annular concave groove 7a of the supporting portion 7.

Figure 4:
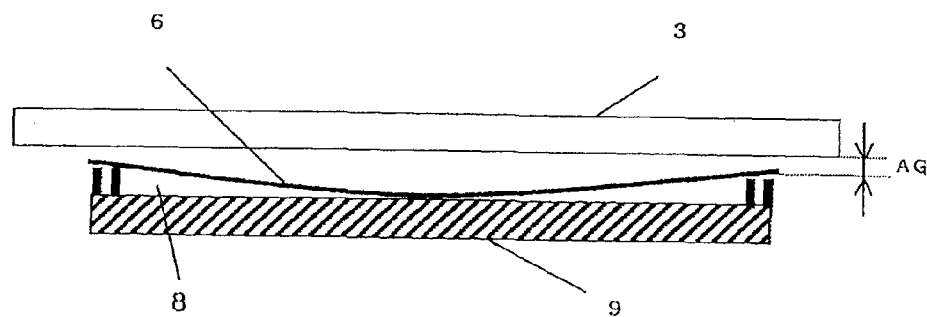
FIG. 4 is a cross sectional view showing a state where a thin plate shaped-work is supported by an outer peripheral portion of the work stage.

(2) Then, as shown in FIG. 4, the work stage 9 is moved upward or the mask holder 4 is moved downward thereby to provide a gap (for example, 30 μm) which corresponds to an alignment gap AG between the thin plate shaped-work 6 and the photomask 3.

Figure 5:
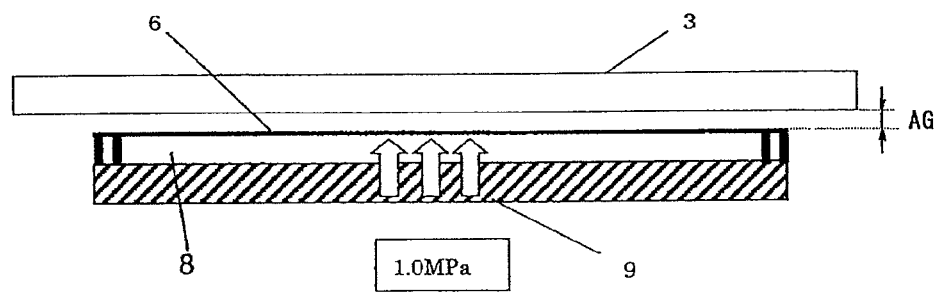
FIG. 5 is a cross sectional view showing a state where the thin plate shaped-work is supported by the outer peripheral portion of the work stage at a time of aligning step.

(3) Further, when the solenoid valves 24a is opened and the blower 27 is driven as shown in FIG. 5, the air having a pressure of about 1.0 MPa is introduced from the plurality of introducing holes 13 into the hollow portion 8, and the air is blown to a central portion 6a of the thin plate shaped-work 6 whereby the deflection of the thin plate shaped-work 6 is corrected and the thin plate shaped-work 6 becomes to be parallel with respect to the photomask 3.

(4) Then, the thin plate shaped-work 6 is moved and adjusted its position by using the microscope 10 for alignment use thereby to perform the alignment of the work 6 with respect to the photomask 3.

Respective exposing methods to be performed after the above aligning operation will be explained with reference to FIG. 6 to FIG. 8.

Figure 6:
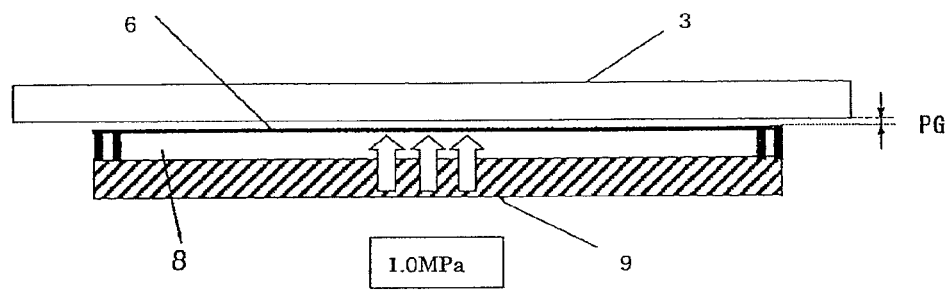
FIG. 6 is a cross sectional view showing a state where the thin plate shaped-work is supported by the outer peripheral portion of the work stage at a time of proximity exposing operation.

(5a) At first, in case of the proximity exposing operation in which the exposing operation is performed in a state where a gap (proximity gap) is formed between the photomask 3 and the thin plate shaped-work 6, the work stage 9 is moved upward or the mask holder 4 is moved downward thereby to provide the gap (for example, 30 μm) which corresponds to the alignment gap AG between the thin plate shaped-work 6 and the photomask 3 as shown in FIG. 6.

(6a) Subsequently, the lamp-house shutter of the high-pressure mercury lamp 11 is opened thereby to perform the exposing operation.

(7a) Then, after the work stage 9 is moved downward or the mask holder 4 is moved upward, the drive of the vacuum pump 20 is stopped and a vacuum state in the annular concave groove 7a of the work stage 9 is released and the thin plate shaped-work 6 is taken out thereby to terminate the exposing operation.

Next, there will be explained about the soft contact exposing operation in which the exposing operation is performed in a state where the mask holder 4 after completion of the aligning step and the work stage 9 are mechanically contacted to each other.

Figure 7:
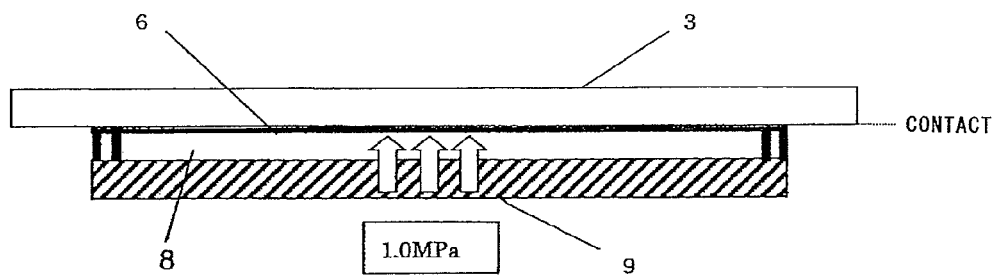
FIG. 7 is a cross sectional view showing a state where the thin plate shaped-work is supported by the outer peripheral portion of the work stage at a time of soft contact exposing operation.

(5b) At first, the work stage 9 is moved upward or the mask holder 4 is moved downward whereby the thin plate shaped-work 6 and the photomask 3 are closely contacted as shown in FIG. 7.

(6b) Then, the lamp-house shutter of the high-pressure mercury lamp 11 is opened thereby to perform the exposing operation.

(7b) Then, after the work stage 9 is moved downward or the mask holder 4 is moved upward, the drive of the vacuum pump 20 is stopped and a vacuum state in the annular concave groove 7a of the work stage 9 is released and the thin plate shaped-work 6 is taken out thereby to terminate the exposing operation.

Next, there will be explained about the hard contact exposing operation in which the exposing operation is performed in a state where a close contact state between the photomask 3 and the thin plate shaped-work 6 is enhanced from the state in the soft contact operation by applying a vacuum force or fluid force after completion of the aligning step.

(5c) At first, after the work stage 9 is moved upward or the mask holder 4 is moved downward, the drive of the vacuum pump 20 is stopped and a vacuum state in the annular concave groove 7a of the work stage 9 is released. Then, the solenoid valve 18a is opened and the blower 19 is driven, the air having a pressure of about 1.2 MPa is introduced from vacuum suction holes 7b into the annular concave groove 7a, and the air is blown to a peripheral portion 6b of the thin plate shaped-work 6 whereby the thin plate shaped-work 6 is closely contacted to the photomask 3.

Figure 8:
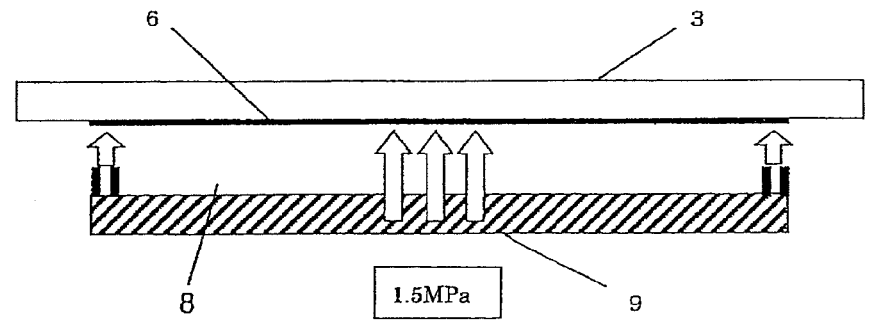
FIG. 8 is a cross sectional view showing a state where the thin plate shaped-work is closely contacted to a photomask at a time of hard contact exposing operation.

Further, when the solenoid valves 24a is closed while the solenoid valves 24b is opened and the blower 27 is driven, the air having a pressure of about 1.5 MPa which is higher than that in the aligning step is introduced into the hollow portion 8, and the air is blown to a central portion 6a of the thin plate shaped-work 6 so as to move the central portion 6a to a side of the photomask 3 whereby a deflection of the thin plate shaped-work 6 is corrected as shown in FIG. 8.

(6c) Subsequently, the lamp-house shutter of the high-pressure mercury lamp 11 is opened thereby to perform the exposing operation.

(7c) Thereafter, the drive of the blower 27 is stopped and the introduction of the air into the central portion 6a of the thin plate shaped-work 6 is also stopped. In addition, the drive of the blower 19 is stopped and the introduction of the air from the sucking holes 7b into the annular concave groove 7a is also stopped and the solenoid valves 18b is opened while the vacuum pump 20 is driven, whereby an inside of the annular concave groove 7a is made to be vacuum and the peripheral portion 6b of the thin plate shaped-work 6 is sucked and fixed to the annular concave groove 7a of the supporting portion 7.

(8c) Then, after the work stage 9 is moved downward or the mask holder 4 is moved upward, the drive of the vacuum pump 20 is stopped and a vacuum state in the annular concave groove 7a of the work stage 9 is released and the thin plate shaped-work 6 is taken out thereby to terminate the exposing operation.

Figure 9:
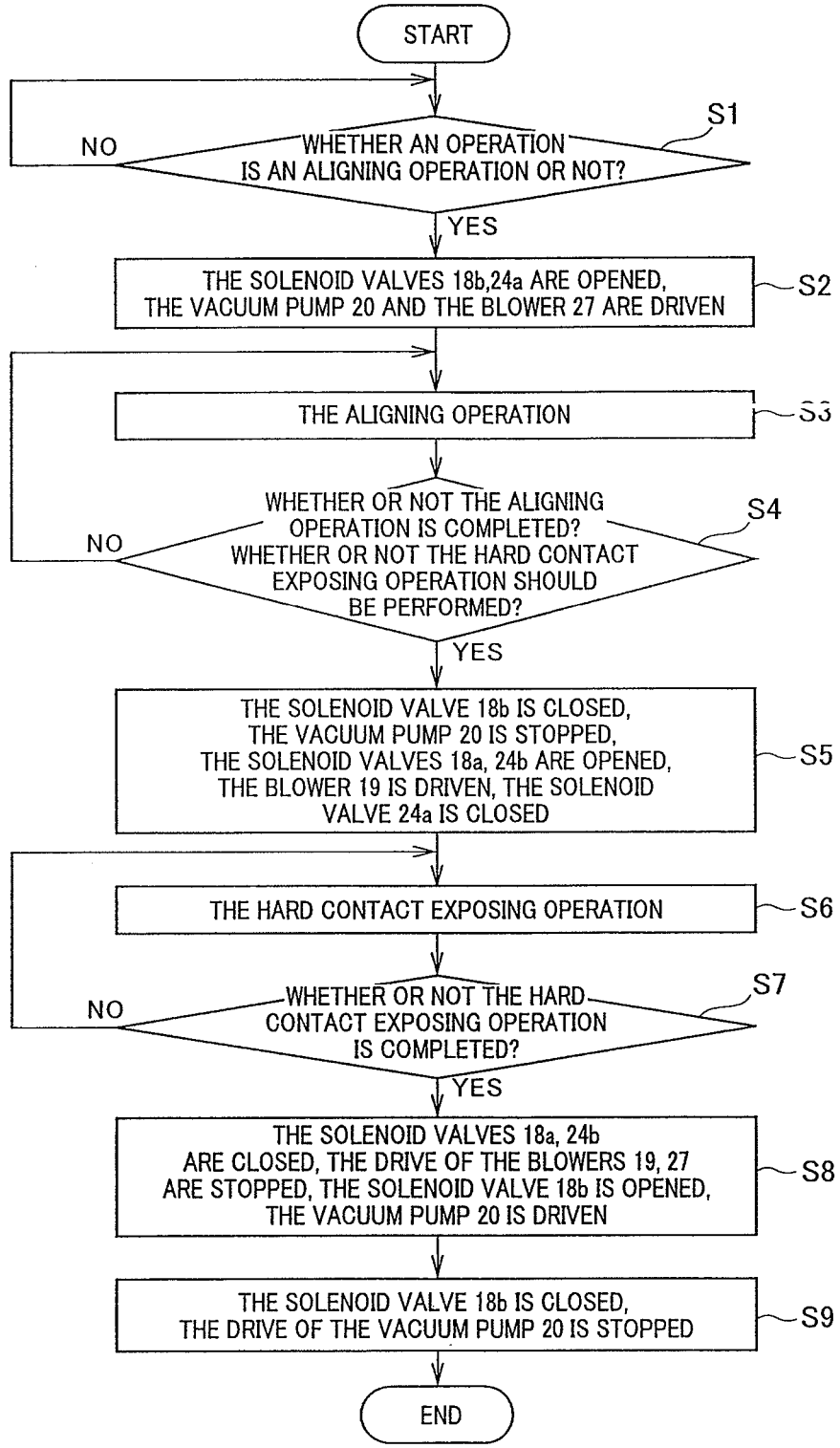
FIG. 9 is a flow diagram showing an alignment process and an exposing process in the first embodiment.

Next, an aligning treatment and a hard contact exposing treatment using the exposing apparatus configured as above will be explained on the basis of a flow chart (flow diagram) shown in FIG. 9. In this regard, the solenoid valves 18a, 18b, 24a, 24b are normally in closed state, while the blower 19, the vacuum pump 20 and the blower 27 are normally in OFF state.

At first, in step S1, whether an operation is an aligning operation or not is judged. Concretely, a position of the microscope 10 is moved to an observation position is detected. In case of no aligning operation (No in step S1), the operation is held until the aligning operation is ordered.

On the other hand, In case of the aligning operation (Yes in step S1), the operation is advanced to step S2, and the thin plate-shaped work 6 of which both sides are to be worked is installed on the supporting portion 7 of the work stage 9 equipped in an exposing apparatus.

Then, in step S2, the solenoid valves 18b is opened and the vacuum pump 20 is driven, whereby the air in the annular concave groove 7a is discharged from the vacuum suction holes 7b and an inside of the annular concave groove 7a is made to be vacuum whereby the peripheral portion 6b of the thin plate shaped-work 6 is sucked and fixed to the annular concave groove 7a of the supporting portion 7.

Subsequently, the work stage 9 is moved upward or the mask holder 4 is moved downward in the exposing apparatus thereby to provide the gap (for example, 30 μm) which corresponds to the alignment gap AG between the thin plate shaped-work 6 sucked by the supporting portion, and the photomask 3.

Further, when the solenoid valves 24a is opened and the blower 27 is driven, the air having a pressure of about 1.0 MPa is introduced from the plurality of introducing holes 13 into the hollow portion 8 formed to an inside of the supporting portion, and the air is blown to a central portion 6a of the thin plate shaped-work 6 whereby the deflection of the thin plate shaped-work 6 is corrected and the thin plate shaped-work 6 becomes to be parallel with respect to the photomask 3.

In the following step 3, a laminated body (superposed body) of the thin plate shaped-work 6 and the photomask 3 is observed by means of the microscope 10 shown in FIG. 1, and a position of the thin plate shaped-work 6 is moved and adjusted, whereby the aligning operation of the thin plate shaped-work 6 is performed. In this case, the thin plate shaped-work 6, which is sucked to the supporting portion 7 by pressure of the introduced air as described above, is in a parallel state with respect to the photomask 3, the positioning operation for the thin plate shaped-work 6 and the photomask 3 can be accurately performed. Due to this effective operation, at the time of performing the aligning operation while observing the laminated body of the thin plate shaped-work 6 and the photomask 3 by using the microscope 10, it becomes possible to prevent the microscope 10 from going out of focus before it happens.

Further, in step 4, whether or not the aligning operation is completed is judged, and the whether or not the hard contact exposing operation should be performed is also judged. Concretely, whether or not the microscope 10 is evacuated from an upper position of the photomask 3 is detected. In a case where the microscope 10 is evacuated from the upper position of the photomask 3 (Yes in step S4), the operation is advanced to step S5. In contrast, in a case where the microscope 10 is not evacuated from the upper position of the photomask 3 (No in step S4), the operation is returned to step S3, and the aligning operation is continued until the microscope 10 is evacuated.

Further, in step 5, since the aligning operation is completed, after the work stage 9 is moved upward or the mask holder 4 is moved downward, the solenoid valve 18b is closed and the drive of the vacuum pump 20 is stopped while the solenoid valve 18a is opened and the blower 19 is driven, so that the air having a pressure of about 1.2 MPa is introduced from vacuum suction holes 7b into the annular concave groove 7a. Further, the solenoid valves 24a is closed while the solenoid valves 24b is opened, so that the clean air having a pressure of about 1.5 MPa is introduced from the plurality of the introducing holes 13 into the hollow portion 8 formed to an inside of the supporting portion 7, whereby the air is blown to a central portion 6a of the thin plate shaped-work 6 so as to move the central portion 6a to a side of the photomask 3. As a result, a deflection of the thin plate shaped-work 6 is corrected while an entire surface of the thin plate shaped-work 6 is closely contacted to the photomask 3 as shown in FIG. 8.

In the following step S6, the lamp-house shutter of the high-pressure mercury lamp 11 turning-on is opened and the hard contact exposing operation is performed. Concretely, when the lamp-house shutter is opened, the mercury lamp 11 in a turn-on state irradiates a light on the thin plate shaped-work 6 from an upper side of the photomask 3. Due to this irradiation of the light, a pattern of the photomask 3 is formed as a latent image on the resist film of the thin plate shaped-work 6.

Thereafter, the resist film is developed, so that the pattern is revealed on entire surface of the thin plate shaped-work 6. At this time, since the entire surface of the thin plate shaped-work 6 is closely contacted to the photomask 3 with a uniform pressure, the resulting pattern of the thin plate shaped-work 6 can be formed with a uniform resolution degree in the entire surface thereof. In this case, since the work stage 9 is in non-contacted state with respect to the rear surface of the thin plate-shaped work 6, so that it becomes possible to prevent the rear surface of the thin plate shaped-work 6 from being contaminated and damaged.

Further, in step S7, whether or not the hard contact exposing operation is completed is judged. Concretely, whether the lamp-house shutter of the high-pressure mercury lamp 11 is opened or not is judged. In a case where the lamp-house shutter of the high-pressure mercury lamp 11 is closed (Yes in step S7), the operation is advanced to step S8, while in a case where the lamp-house shutter of the high-pressure mercury lamp 11 is opened (No in step S7), the operation is returned to step S6, and the exposing operation is continuously performed until the exposing operation is completed.

Further, in step S8, the solenoid valves 18*a* is closed, the drive of the blower 19 is stopped and the solenoid valve 24*b* is closed, the drive of the blower 27 is stopped and the solenoid valve 18*b* is opened while the vacuum pump 20 is driven, whereby an inside of the annular concave groove 7*a* of the work stage 9 is made to be vacuum and the peripheral portion 6*b* of the thin plate shaped-work 6 is sucked and fixed to the annular concave groove 7*a* of the supporting portion 7.

Thereafter, in step S9, after the work stage 9 is moved downward or the mask holder 4 is moved upward, the solenoid valves 18*b* is closed, the drive of the vacuum pump 20 is stopped, so that the vacuum state in the annular concave groove 7*a* of the work stage 9 is released and the thin plate shaped-work 6 formed with the pattern is taken out whereby a series of aligning treatment and the hard contact exposing treatment are terminated.

As described above, according to the present embodiment, at the time of aligning operation in which the positions of the thin plate shaped-work 6 and the photomask 3 are adjusted, the air in the annular concave groove 7*a* is discharged from the vacuum sucking hole 7*b*, so that the peripheral portion 6*b* of the thin plate shaped-work 6 is sucked and fixed to the annular concave groove 7*a* of the supporting portion 7.

In addition, the air having a pressure of about 1.0 MPa is introduced from the plurality of introducing holes 13 into the hollow portion 8, and the air is blown to a central portion 6*a* of the thin plate shaped-work 6 whereby the deflection of the thin plate shaped-work 6 is corrected and the thin plate shaped-work 6 becomes to be parallel with respect to the photomask 3.

That is, in the present embodiment, the deflection caused at the central portion 6*a* of the thin plate-shaped work 6 is corrected at the aligning step in which both front and rear surfaces of the thin plate shaped-work 6 are subjected to work, the deflection being caused by supporting the peripheral portion 6*b* of the thin plate shaped-work 6 by the supporting portion 7.

As a result, at the time of performing the aligning operation while observing the laminated body of the thin plate-shaped work 6 and the photomask 3 by means of the microscope 10, the aligning operation can be accurately performed without causing any contamination or damage on the rear surface of the thin plate-shaped work 6, while a parallel state of the thin plate-shaped work 6 with respect to the photomask 3 is sufficiently maintained. Due to this configuration, the accuracy in alignment can be greatly improved, whereby a production yield can be also greatly increased.

Further, even in a case where either one of exposing systems of the proximity exposing, the soft contact exposing and the hard contact exposing is adopted, the exposing operation can be performed while maintaining a parallel state of the thin plate shaped-work 6 with respect to the photomask 3.

Further, according to the present embodiment, the exposing method further comprises a contacting step in which the thin plate-shaped work 6 is closely contacted to the photomask 3 while the deflection of the thin plate-shaped work 6 is corrected before the exposing operation, and the entire surface of the thin plate shaped-work 6 is closely contacted to the photomask 3 with a uniform pressure, so that the resulting pattern of the thin plate shaped-work 6 can be formed with a uniform resolution degree in the entire surface thereof. In this case, since the work stage 9 is in non-contacted state with respect to the rear surface of the thin plate-shaped work 6, so that it becomes possible to prevent the rear surface of the thin plate shaped-work 6 from being contaminated and damaged.

Furthermore, according to the present embodiment, a pressure of the fluid in the contacting step is set to be higher than that of in the deflection correcting step. Therefore, at the hard contact exposing operation, it becomes possible to maintain the parallel state of the thin plate shaped-work 6 with respect to the photomask 3 in also both the aligning step and the exposing step. Therefore, the accuracy in alignment and exposing operation can be improved, and a uniformity in in-plane distribution of pattern shape can be also improved thereby to also improve the production yield. In this case, the work stage 9 is in non-contacted state with respect to the rear surface of the thin plate-shaped work 6, so that it becomes possible to prevent the rear surface of the thin plate shaped-work 6 from being contaminated and damaged.

Still further, according to the present embodiment, the work stage of an exposing apparatus comprises: the deflection correcting device for correcting a deflection caused at a central portion of the thin plate-shaped work 6 by introducing air into the hollow portion 8; at least two branch hoses 23*a*, 23*b* as fluid introducing systems each introducing the air having a different pressure to each other into the hollow portion 8; and solenoid valves 24*a*, 24*b* as opening/closing devices provided to the respective branch hoses 23*a*, 23*b*; the branch hoses 23*a*, 23*b* as fluid introducing systems are configured such that: i) an air pressure at a time of an alignment operation in which position of the thin plate-shaped work 6 of which peripheral portion 6*b* is supported by the supporting portion 7 and position of the photomask 3 are adjusted; and ii) an air pressure at a time of a hard contact exposing operation in which the thin plate-shaped work 6 is closely contacted to the photomask 3; are set to be changeable by switching the solenoid valves 24*a*, 24*b* as opening/closing devices provided to the respective branch hoses 23*a*, 23*b*.

Therefore, it becomes possible to maintain the parallel state of the thin plate shaped-work 6 with respect to the photomask 3 in both the aligning step and the hard contact exposing step, so that the accuracy in alignment can be improved, and uniformity in in-plane distribution of pattern shape can be also improved. As a result, a production yield can be also increased.

Furthermore, according to the present embodiment, the solenoid valves 24*a*, 24*b* are controlled by a control unit 30 so as to automatically open/close the solenoid valves 24*a*, 24*b*.

Therefore, the air pressure at the aligning step and the hard contact exposing step can be automatically switched and changed. In addition, the air pressure for the hard contact exposing step is set to higher than that for the aligning step, so that the exposing operation for the hard contact exposing step can be performed while maintaining the parallel state of the thin plate-shaped work 6 with respect to the photomask 3.

Due to the above configuration, it becomes possible to maintain an almost parallel state of the thin plate shaped-work 6 with respect to the photomask 3 in both the aligning step and the exposing step, so that the accuracy in alignment and exposing operation can be improved, and uniformity in in-plane distribution of pattern shape can be also improved. As a result, a production yield can be also increased.

According to the present embodiment, the air is introduced from the introducing hole 13 into the hollow portion 8 and the air is discharged to outside of the hollow portion 8 through the discharging hole 35, whereby the deflection caused at a central portion 6a of the thin plate shaped-work 6 is corrected. Therefore, it becomes possible to prevent a rapid rising of the air pressure.

Further, according to the present embodiment, the work stage further comprises a vacuum sucking device for sucking the peripheral portion 6b of the thin plate-shaped work 6 to the supporting portion 7 at a time of alignment operation. Therefore, the thin plate-shaped work 6 can be easily and firmly fixed to the supporting portion 7 at the aligning step, so that a positioning operation of the thin plate shaped-work 6 and the photomask 3 can be performed with a higher accuracy.

In this connection, the present embodiment is configured such that the solenoid valves 24a, 24b are controlled by the control unit 30 so as to automatically open/close. However, the present invention is not limited thereto. The solenoid valves 24a, 24b may be also configured so as to manually open/close.

<Second Embodiment>

Figure 10:
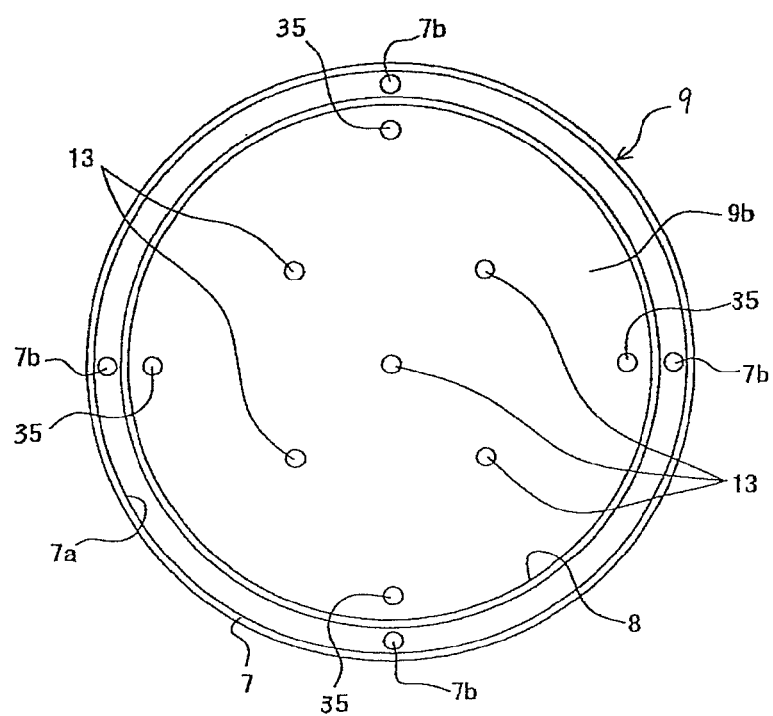
FIG. 10 is a plan view showing a work stage according to a second embodiment.
Figure 11:
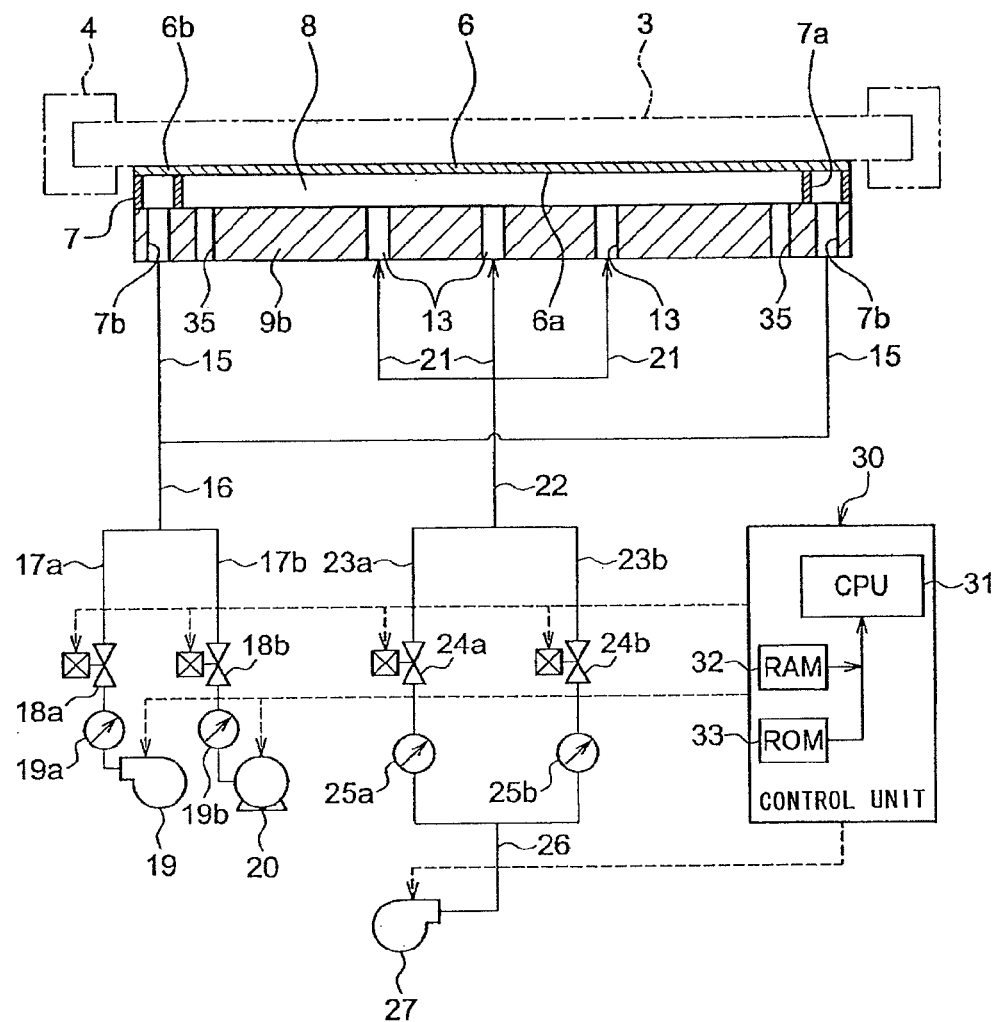
FIG. 11 is a system diagram of a deflection correcting device of the work stage shown in FIG. 10.
Figure 1:
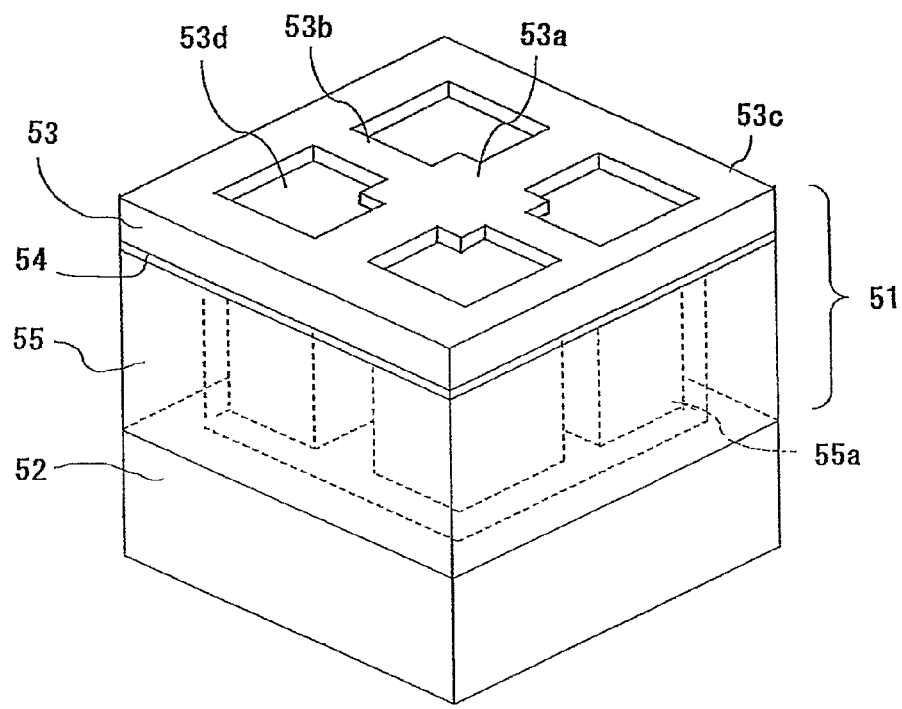

FIG. 10 is a plan view showing a work stage according to a second embodiment, and FIG. 11 is a vertically cross sectional view of the work stage shown in FIG. 10. In this regard, it is to be noted in the second embodiment that the same reference numerals are used to denote the same elements or members as those used in the first embodiment, and the detailed explanations of these elements or members will be omitted hereunder.

As shown in FIGS. 10 and 11, in the work stage 9 of an exposing apparatus used in the second embodiment, air as a fluid is introduced from the introducing holes 13 into the hollow portion 8, and the deflection caused at a central portion 6a of the thin plate shaped-work 6 is corrected while the air is discharged to outside of the hollow portion 8 through the discharging holes 35. The discharging holes 35 are formed to a base portion 9b of the work stage 9 so as to oppose to the peripheral portion 6b of the thin plate-shaped work 6.

According to the present second embodiment, the deflection of the thin plate shaped-work 6 is corrected while the air is flown between inside and outside of the hollow portion 8, and the parallel state of the thin plate shaped-work 6 with respect to the photomask 3 can be maintained while preventing an abrupt rising of the air pressure. The other structural elements and functions thereof are the same as those of the first embodiment, so that the explanations for the other structural elements and functions thereof are omitted.

Hereunder, a method of manufacturing an MEMS (Micro Electro Mechanical Systems) product as one example of a structure manufactured by using the thin plate shaped-work to be exposed in accordance with the exposing method of above embodiment will be explained with reference to the accompanying drawings.

It is noted in the present specification that a structure manufactured by using the thin plate shaped-work directs to a structural body in which wiring, functional parts, and groove or the like are formed on front and/or rear surface of the thin plate shaped-work.

In this regard, the MEMS product means a functional device in which a micro structure is provided on a semiconductor substrate. Examples of the MEMS product may include: a sensor MEMS represented by a dynamic quantitative sensor; an optical MEMS represented by an optical mirror or the like; a RF-MEMS represented by a RF (Radio Frequency) switch; a bio-MEMS represented by a bio-filter or a μ-TAS (Micro Total Analysis System) or the like. Especially, the exposing method according to the above embodiment is suitable for manufacturing the MEMS product having a micro structure provided to both front and rear surfaces of a substrate.

<Structure of Acceleration Sensor>

As one example of a method of manufacturing the MEMS product to which the exposing method according to the above embodiment is applied, a method of manufacturing an acceleration sensor will be explained. Hereunder, a structure of the acceleration sensor to be manufactured by the exposing method according to the above embodiment and a method of manufacturing the acceleration sensor will be explained.

Figure 13:
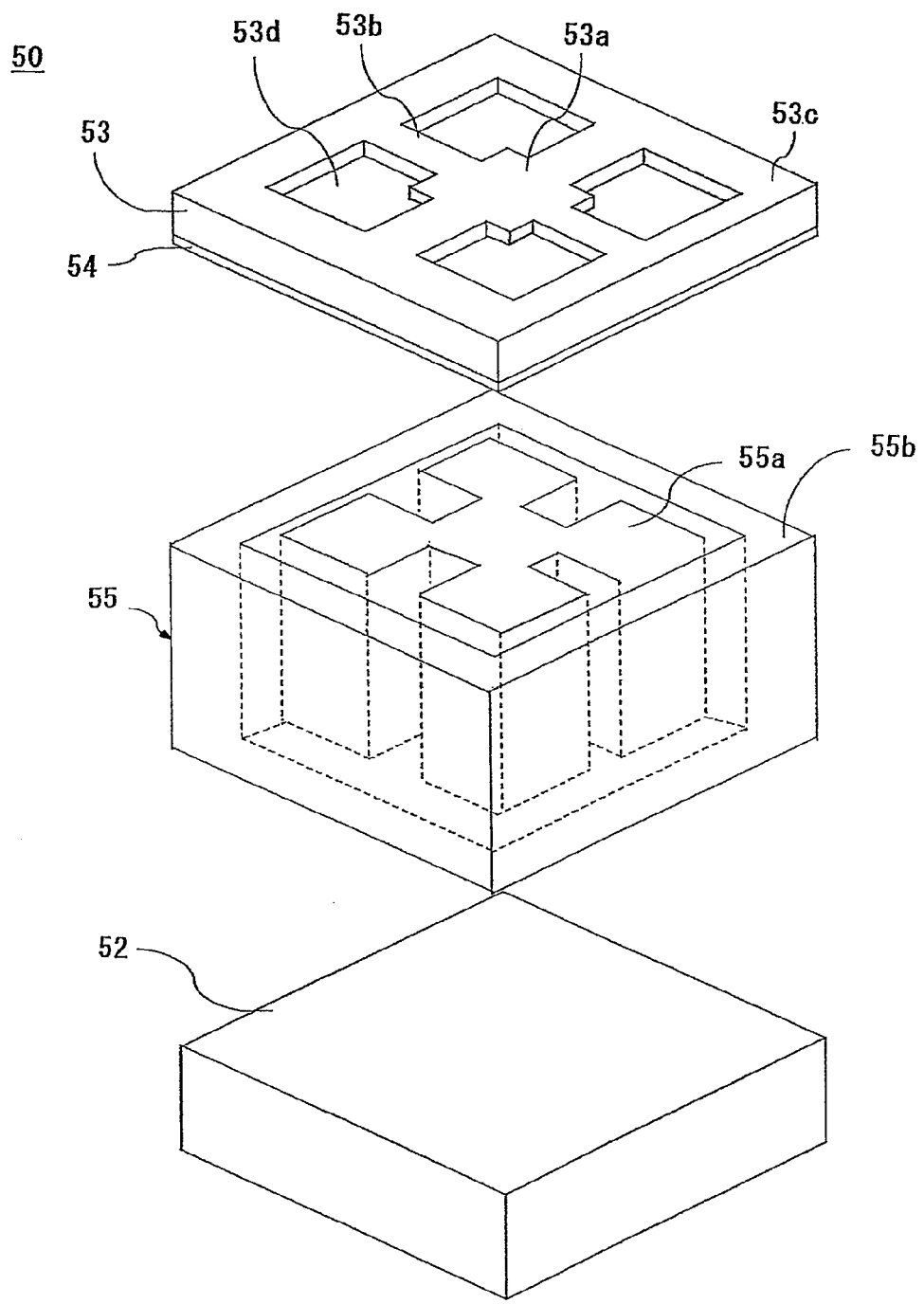
FIG. 13 is an exploded perspective view showing an acceleration sensor to which the embodiment of the present invention is applied.
Figure 14A:
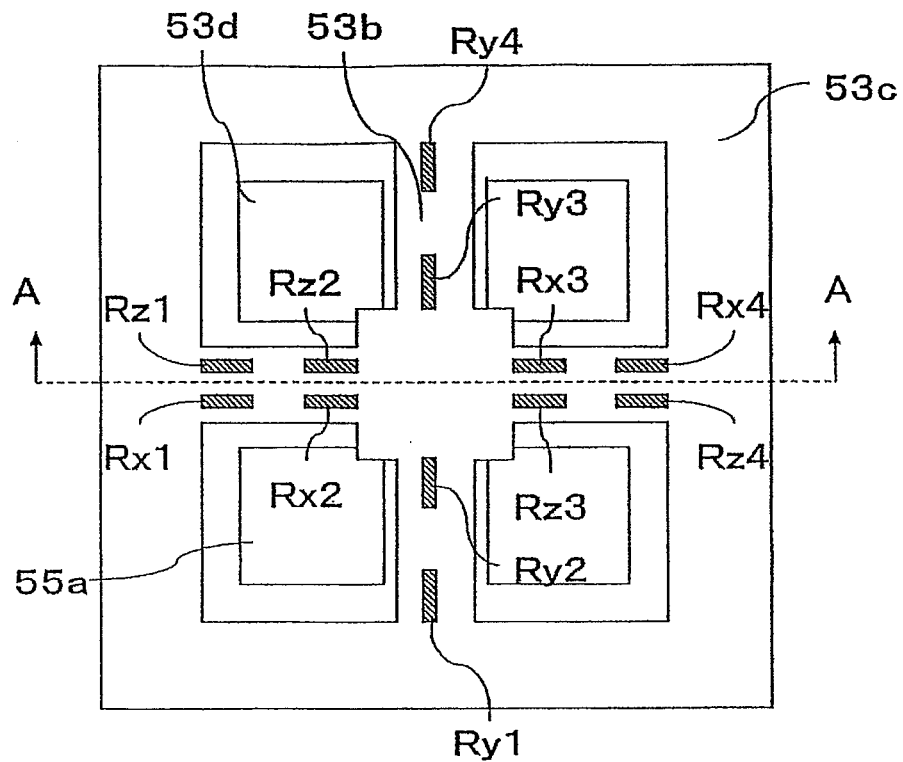
FIG. 14A is an upper surface view showing an acceleration sensor to which the embodiment of the present invention is applied.
Figure 14B:
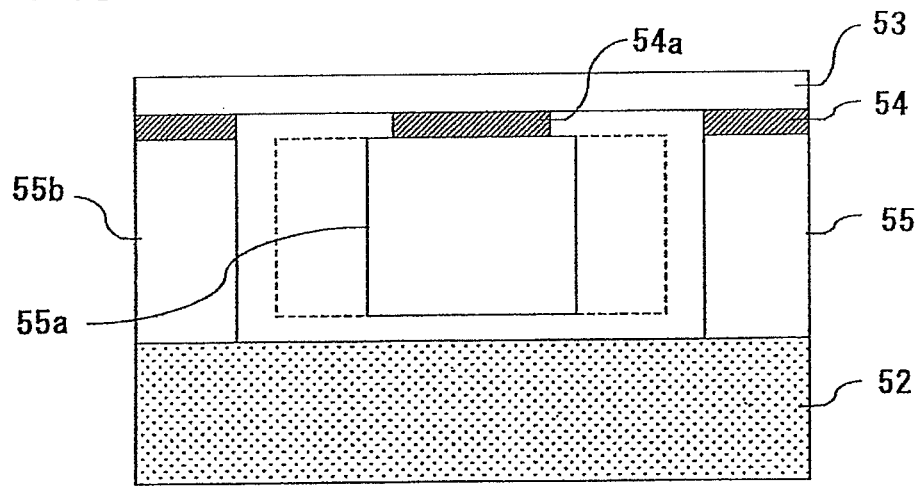
FIG. 14B is a cross sectional view taken along a line A-A in FIG. 14A.

FIGS. 12 to 14 are views each showing an acceleration sensor to which the embodiment of the present invention is applied. FIG. 12 is a perspective view showing an acceleration sensor. FIG. 13 is an exploded perspective view showing an acceleration sensor. FIG. 14A is an upper surface view showing an acceleration sensor. FIG. 14B is a cross sectional view taken along a line A-A in FIG. 14A. (It is noted that wiring portions or the like are omitted in FIGS. 14A and 14B in order to easily observe the drawings.) As shown in FIG. 14A, an acceleration sensor 50 is formed to have an almost square shape at upper surface, and has a size of square 2 mm on a side.

As shown in FIG. 12, the acceleration sensor 50 is composed of a semiconductor substrate comprising: a first layer composed of semiconductor material; a second layer composed of insulating material; and a third layer composed of semiconductor material that are laminated in this order. The semiconductor substrate is, for example, an SOI (Silicon On Insulator) substrate 51. In this case, the SOI substrate 51 comprises: the first layer which is an active layer 53 composed of silicon; the second layer which is a BOX (Buried Oxide film) layer 54 composed of silicon dioxide; and the third layer which is a supporting layer 55 composed of silicon, the respective layers have thicknesses of, for example, 10 μm, 1 μm and 725 μm. A lower surface (a surface of the supporting layer 55 side) of the SOI substrate 51 and an upper surface of the glass substrate 52 are bonded thereby to be integrally formed.

As a material for constituting the glass substrate 52, for example, a Pyrex (registered trademark) glass containing a movable ion such as Na ion or the like is used. The SOI substrate 51 and the glass substrate 52 are bonded by an anode joint method as described later on. The glass substrate 52 has a stopper function of preventing an excessive displacement of a weight portion 55a as described later, and has a supporting function of supporting the sensor as a pedestal. As far as a material carries out both the stopper function and the supporting function, the material is not limited to glass. As example of such material, for example, silicon, resin, metal or the like can be also used. A thickness of the glass substrate 52 is set to, for example, about 600 µm.

The above acceleration sensor 50 is separately arranged in a multiple patterned form on the one SOI substrate 51 having a diameter of 200 mm.

The active layer 53 is provided with: a fixing portion 53c having four opening portions 53d; a displacing portion 53a for displacing with respect to the fixing portion 53c, the displacing portion 53a being provided in the opening portion 53d and having a quadrangular plain shape when it is viewed fro upper side; and four connecting portions 53b for connecting the fixing portion 53c to the displacing portion 53a. These connecting portions 53b are formed with piezometric resistors R as shown in FIG. 14A described later.

As shown in FIG. 13, the supporting layer 55 is provided with: a weight portion 55a bonded to the displacing portion 53a through the connecting portions 54a provided to the BOX layer 54, the weight portion 55a having a shape of a cloverleaf when it is viewed from an upper surface thereof; and a frame portion 55b bonded to the fixing portion 53c and provided so as to encircle the weight portion 55a. As shown in FIG. 14B, the weight portion 55a is in a hollow state, and is supported so as to be able to displace when a shock is applied from outside thereto.

As shown in FIG. 14A, end portions where the connecting portions 53 are connected to the displacing portion 53a and end portions where the connecting portions 53 are connected to the fixing portion 53a are arranged with three sets of piezometric resistor elements Rx1-Rx4, Ry1-Ry4 and Rz1-Rz4 on the connecting portions in a longitudinal direction thereof. In this regard, the three sets of piezometric resistor elements R in total 12 pieces are formed of an impurity-diffused wiring, and the piezometric resistors R are jointed to patterns composed of the impurity-diffused wiring. On the patterns composed of the impurity-diffused wiring, there is formed an opening portion at a predetermined position, and an aluminum wiring is connected to the opening portion (patterns or the like are omitted and not shown in figures.). The patterns and the aluminum wiring constitute a Wheatstone bridge circuit, and this circuit is operated as the following manner.

<Operation of Acceleration Sensor>

A principle of detecting the acceleration using the acceleration sensor 50 will be explained hereunder. As described hereinbefore, at the connecting portions 53b are arranged with total 12 of the piezometric resistor elements Rx1-Rx4, Ry1-Ry4 and Rz1-Rz4 as shown in FIG. 14A.

Each of the piezometric resistor elements Rx1-Rx4, Ry1-Ry4 and Rz1-Rz4 can be configured by a P-type or N-type impurity-doped region (piezometric resistor element R) that are formed to a portion close to upper surface of the connecting portions 53b composed of silicon.

The three sets of the piezometric resistor elements Rx1-Rx4, Ry1-Ry4 and Rz1-Rz4 are provided so as to be arranged in a straight line extending in an X-axial direction or Y-axial direction.

In this regard, the arrangements of the piezometric resistor elements Rx1-Rx4, and Rz1-Rz4 are different in accordance with the connecting portions 53b. This is because that it is necessary to detect a distortion of the connecting portions 53b by using the piezometric resistor elements R with a higher accuracy.

The three sets of the piezometric resistor elements Rx1-Rx4, Ry1-Ry4 and Rz1-Rz4 function as respectively X, Y, Z-axial direction component detecting portions for detecting displacements of the X, Y, Z-axial direction components of the weight portion 55a. In this connection, it is not always necessary for the four peaces of the piezometric resistor elements Rz1-Rz4 to arrange in X-axial direction, and the piezometric resistor elements Rz1-Rz4 can be also arranged in Y-axial direction.

Direction and amount or magnitude of the acceleration can be detected from each of a combination of an expansion (+) and a contraction (−) of the piezometric resistor elements R, and an amount of the expansion or the contraction of the piezometric resistor elements R. The amount of the expansion or contraction of the piezometric resistor elements R can be detected as a change in resistance of the piezometric resistor elements R.

For example, there is assumed a case where a crystal plane index of the material constituting the connecting portions 53b is {100} and a crystal orientation of the piezometric resistor elements R in a longitudinal direction is <110>. In this case, each of the piezometric resistor elements R is configured by a P-type impurity doping into silicon. At this time, the resistance of the piezometric resistor elements R in a longitudinal direction is increased when a stress in an expanding direction is applied thereto, while the resistance of the piezometric resistor elements R is decreased when a stress in a contracting direction is applied thereto. By the way, when each of the piezometric resistor elements R is configured by an N-type impurity doping into silicon, the increase and the decrease of the resistance are changed inversely.

In order to detect the respective acceleration components of X, Y, Z-axial directions, the bridge circuits composed of four sets of the piezometric resistor elements R is configured thereby to detect a bridge voltage.

In these bridge circuits, relations between input voltage Vin (Vx-in, Vy-in, Vz-in) and output voltage Vout (Vx-out, Vy-out, Vz-out) are expressed by the following equations (1) to (3).

$$Vx\text{-out}/Vx\text{-in}=[Rx4/(Rx1+Rx4)-Rx3/(Rx2+Rx3)] \quad \text{Equation (1)}$$

$$Vy\text{-out}/Vy\text{-in}=[Ry4/(Ry1+Ry4)-Ry3/(Ry2+Ry3)] \quad \text{Equation (2)}$$

$$Vz\text{-out}/Vz\text{-in}=[Rz3/(Rz1+Rz3)-Rz4/(Rz2+Rz4)] \quad \text{Equation (3)}$$

The acceleration is proportional to an expanding/contracting amount of the piezometric resistor elements R, and the expanding/contracting amount of the piezometric resistor elements R is proportional to a change of a resistance value R. As a result, the ratio of the output voltage with respect to the input voltage, i.e., Vx-out/Vx-in, Vy-out/Vy-in, Vz-out/Vz-in are proportional to the acceleration, whereby it becomes possible to independently measure the acceleration components in X, Y, Z-axial directions.

<Method of Manufacturing Acceleration Sensor>

Figure 15:
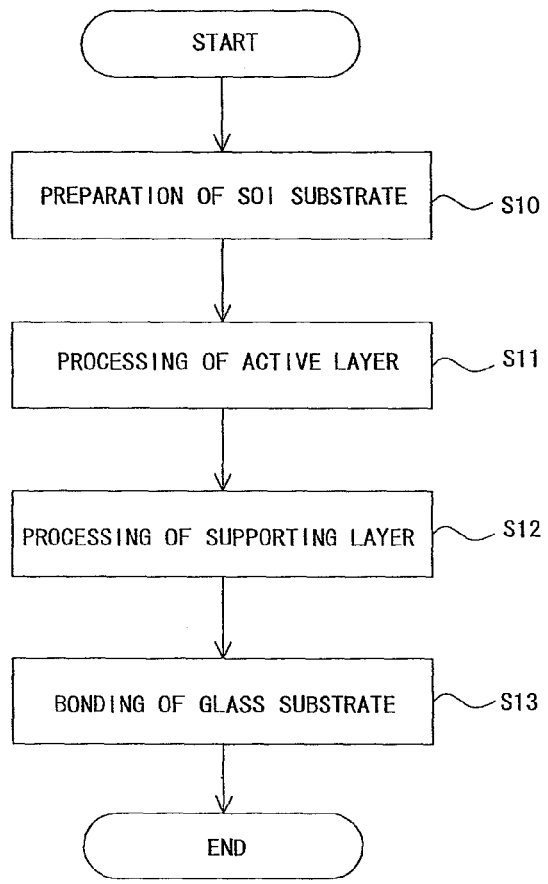
FIG. 15 is a flow diagram showing one example of preparing procedure of an acceleration sensor to which the embodiment of the present invention is applied.

Next, on the basis of the structure as described above, a manufacturing process of the acceleration sensor 50 will be explained. FIG. 15 is a flow diagram showing one example of manufacturing process of the acceleration sensor to which the embodiment of the present invention is applied. FIGS. 16A to 16E are cross sectional views each showing a state of the acceleration sensor in the respective manufacturing processes.

Figure 16A:
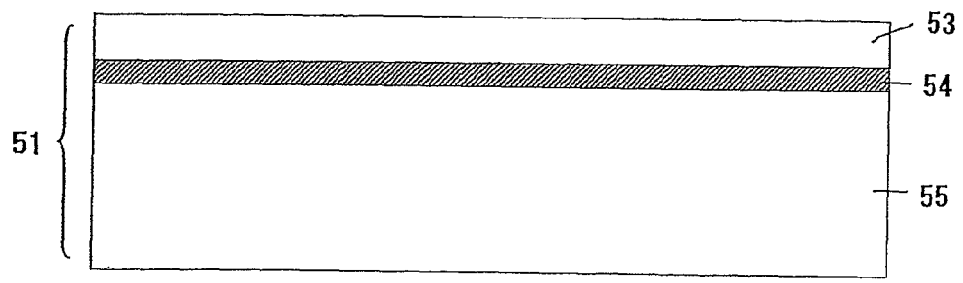
FIG. 16A is a cross sectional view showing a state of an acceleration sensor in the preparing procedure shown in FIG. 15.

(1) Preparation of SOI substrate (Step S10, and FIG. 16A)

At first, as shown in FIG. 16A there is prepared an SOI substrate 51 comprising: an active layer 53; a BOX layer 54; and a supporting layer 55. The SOI substrate 51 is prepared by SIMOX (Separated by Implanted Oxygen) method or laminating method or the like.

Figure 16B:
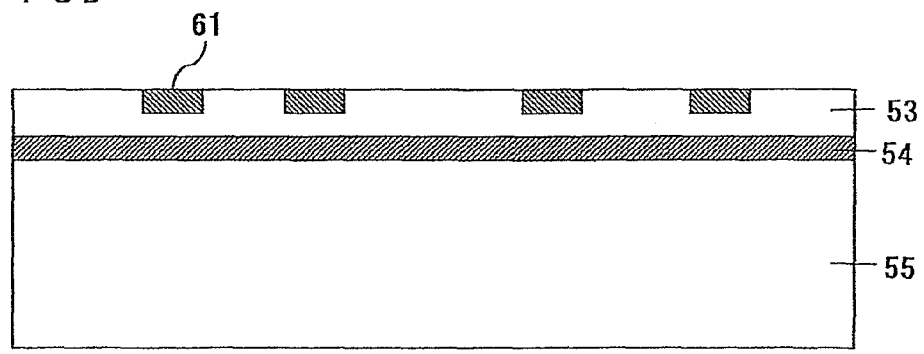
FIG. 16B is a cross sectional view showing a state of an acceleration sensor in the preparing procedure shown in FIG. 15.
Figure 16C:
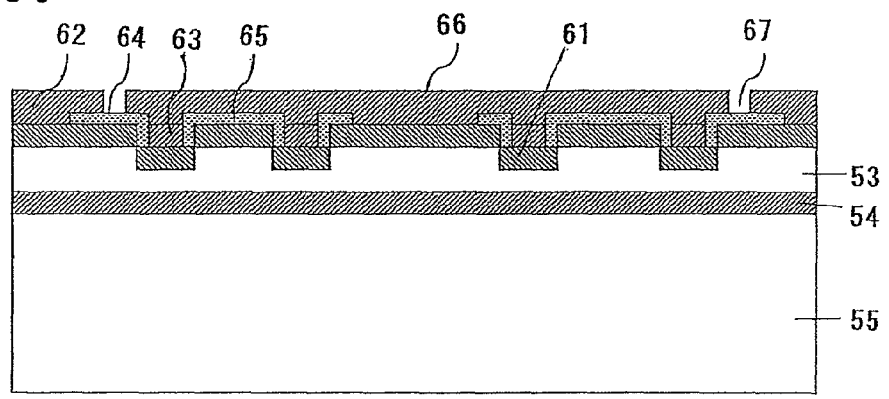
FIG. 16C is a cross sectional view showing a state of an acceleration sensor in the preparing procedure shown in FIG. 15.

(2) Processing of Active Layer (Step S11 and FIGS. 16B to 16C)

The processing of the active layer 53 is performed in the following procedures of a) to e).

a) Formation of Diffusing Layer

The diffusing layer (piezometric resistor) is formed in such a manner that an $Si_3N_4$ (silicon nitride) film is deposited on the active layer 53 by, for example, CVD (Chemical Vapor Deposition) method. Then, a diffusing layer pattern opening (not shown) is formed by RIE (Reactive Ion Etching) method using a resist as mask. Thereafter, an impurity layer including, for example, B (boron) is coated to this pattern opening by a spin-coating method, followed by conducting a heat treatment at temperature of about 1000° C., and the impurity included in the impurity layer is diffused into the active layer, thereby to form the diffusing layer 61. Unnecessary diffusion mask ($Si_3N_4$) is etched with a hot phosphoric acid thereby to be removed (FIG. 16B).

b) Formation of Wiring

A wiring layer is formed through the following procedures. That is, at first, an insulating layer 62 is formed on the active layer 53. This insulating layer 62 is formed, for example, by thermally oxidizing a surface of the active layer 53 thereby to form the layer composed of silicon dioxide. Then, a contact hole (opening) 63 is formed to the insulating layer 62, for example, by RIE (Reactive Ion Etching) method using a resist as mask.

Thereafter, an Al layer containing Al or Nd is formed on the active layer 53 by using, for example, a sputtering method or a depositing method. The resultant metal layer formed by this deposition is subjected to, for example, a wet-etching treatment using the resist as mask, whereby a wiring 65 is formed on the active layer 53 and an interlayer connecting member 64 is formed in the contact hole 63.

c) Formation of Protection Film (Layer) 66

Next, an $Si_3N_4$ layer is deposited by CVD method thereby to form a protection layer 66 on the active layer 53, and the SOI substrate 51 is subjected to a heat treatment at temperature of about 400° C. whereby the diffusing layer 61 and the wiring 65 are ohmic-contacted. Thereafter, the protection layer 66 is subjected to an etching treatment, for example, by RIE (Reactive Ion Etching) method using the resist as mask thereby to form a pad opening 67 to the protection layer 66 (FIG. 16C).

d) Etching for Active Layer

The active layer 53 is subjected to an etching treatment, so that an opening portion 53d is formed and a displacing portion 53a, connecting portions 53b and a fixing portion 53c are formed as shown in FIGS. 12 and 13. For example, such etching treatment can be performed by adopting an etching method exhibiting an erosive property with respect to the active layer 53 while exhibiting no erosive property with respect to the BOX layer 54 (or exhibiting a less erosive property than that of with respect to the active layer 53). In accordance with this etching treatment, the opening portion 53d is subjected to the etching treatment in the thickness direction until an upper surface of the BOX layer 54 is revealed (FIG. 16C).

Figure 16D:
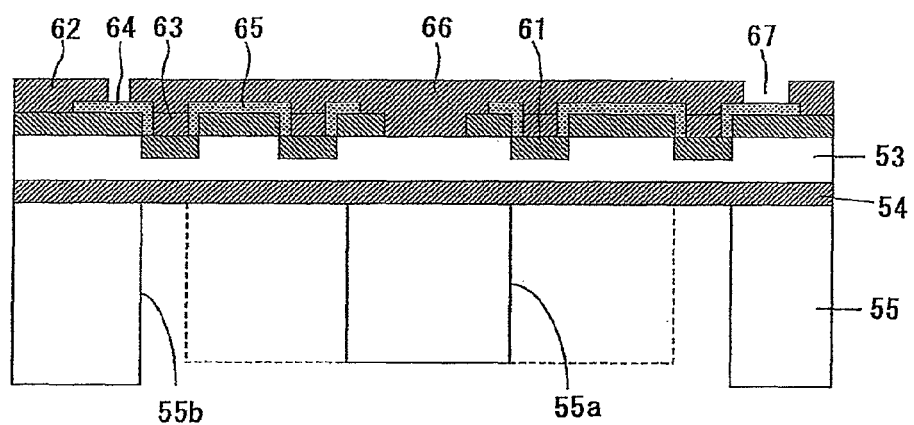
FIG. 16D is a cross sectional view showing a state of an acceleration sensor in the preparing procedure shown in FIG. 15.

(3) Processing for Supporting Layer (Step S12 and FIG. 16D)

A processing (work) for the supporting layer 55 is separately performed in two stages.

Formation of Gap

A resist layer having a pattern corresponding to the frame portion 55b is formed to a lower surface of the supporting portion 55, and an exposed portion which is not covered with the resist layer is eroded in a vertical direction. As a result, a gap (for example, 5-10 μm) is formed to the lower surface of the supporting portion 55. Especially, in the present invention, since the SOI substrate 51 is supported at a peripheral portion thereof, the work stage would not contact to a structural member formed to the active layer 53. Therefore, a fracture or a breakage of fine structural member can be suppressed during the manufacturing process.

Formation of Weight Portion 55a and Frame Portion 55b

Another resist layer having a pattern corresponding to the weight portion 55a and the frame portion 55b is formed to the lower surface of the supporting portion 55, and the exposed portion which is not covered with the resist layer is subjected to an etching treatment by using an etching method described later until a lower surface of the BOX layer 54 composed of silicon oxide film is revealed. Due to this operation, the weight portion 55a and the frame portion 55b (second structural member) are formed (FIG. 16D).

Especially, in the present invention, since the SOI substrate 51 is supported at a peripheral portion thereof, the work stage would not contact to a structural member formed to the active layer 53. Therefore, a fracture or a breakage of fine structural member can be suppressed during the manufacturing process.

In this regard, as conditions of the above exposing operation, in a case where the proximity exposing method or the soft contact exposing method was adopted, the fluid pressure in both the aligning operation and the exposing operation was 10 KPa. Further, in a case where the hard contact exposing method was adopted, the fluid pressure in the aligning operation was 10 KPa. Further, at the time of the exposing operation, the fluid pressure of the follow portion 8 was 50 KPa, while the fluid pressure of the supporting portion 7 was 70 KPa.

As the etching method described above, for example, a DRIE (Deep Reactive Ion Etching) method can be used. In this method, an etching step for eroding and shaving a material layer in its thickness direction and a deposition step for depositing and forming a polymer wall to a side-wall of an eroded hole are alternatively repeated. Thus eroded side wall of the hole is sequentially formed with wall surfaces composed of polymer thereby to be protected, so that it becomes possible to advance the erosion only almost in a thickness direction. It is possible to use an ion-radical supplying gas such as $SF_6$ or the like as the etching gas, while it is possible to use $C_4F_8$ or the like as the deposition gas.

Next, a predetermined region of the BOX layer 54 is subjected to an etching treatment, thereby to form the connecting portions 54a. That is, an etching method exhibiting an erosive property with respect to the BOX layer 54 while exhibiting no erosive property with respect to the active layer 53 and the supporting layer 55 is applied to the BOX layer 54, so that an exposed portion of the BOX layer 54 is subjected to an etching treatment from the exposed portion in a thickness direction and a layer direction.

As the etching method described above, for example, there can be used a wet-etching method using a buffered hydrofluoric acid (for example, a mixed aqueous solution containing 5.5 wt % of HF and 20 wt % of $NH_4F$) as the etching solution.

Figure 16E:
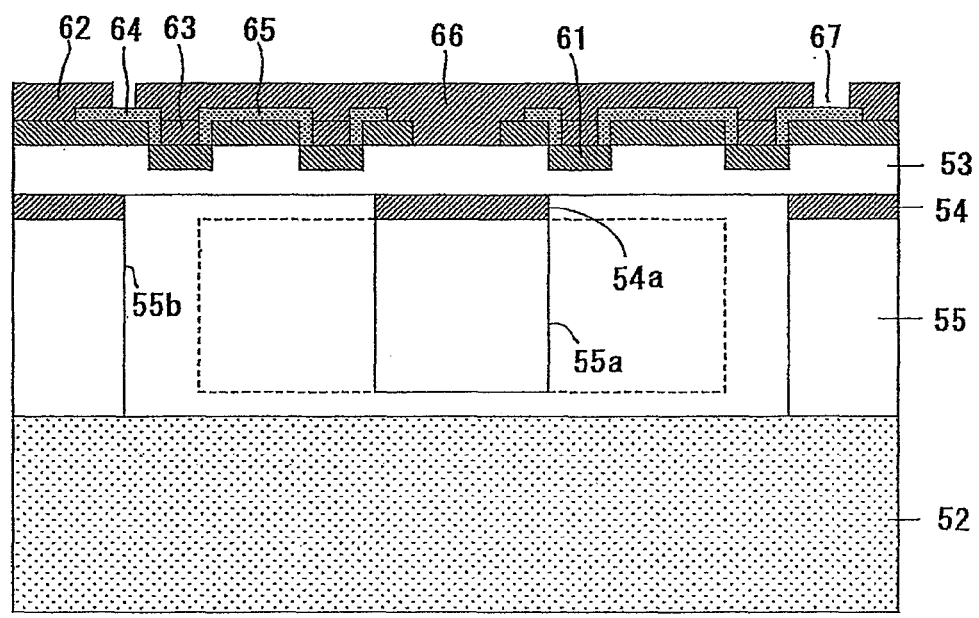
FIG. 16E is a cross sectional view showing a state of an acceleration sensor in the preparing procedure shown in FIG. 15.

(4) Bonding of Glass Substrate 52 (Step S13 and FIG. 16E)

The BOX substrate 51 and a glass substrate 52 are bonded by an anode-bonding method. Namely, when the glass substrate 52 and the frame portion 55b are contacted to each other and heated. In this state, a voltage is applied to a portion between the BOX substrate 51 and the glass substrate 52 whereby the BOX substrate 51 and the glass substrate 52 are bonded through the frame portion 55b serving as a contact point, so that an integrally formed acceleration sensor can be manufactured.

As the glass substrate 52, a substrate composed of material described hereinbefore can be used. For example, in a case where a substrate composed of silicon or the like is used, the substrate can be bonded by a direct bonding method. Further, for example, in a case where a substrate is composed of resin, the substrate can be bonded through an adhesive agent. Furthermore, when a substrate is composed of metal, the substrate can be bonded by a metal bonding method.

Thereafter, the acceleration sensors 50 are cut into chips by means of dicing saw or a laser cutter or the like, thereby to be separated into the respective acceleration sensors. Such acceleration sensor is generally called a piezometric resistor type three-axial acceleration sensor. The acceleration sensors 50 can be also commercially distributed in a state of wafer in which a number of the acceleration sensors 50 are separately assembled in multiple patterned form.

In the steps of manufacturing the above acceleration sensor (MEMS product) 50, when the resist mask is formed by a photo-lithography method, the exposing method according to the above embodiment is used. In a case where the exposing method according to the above embodiment is used for the steps of manufacturing the above acceleration sensor 50, a deflection of the work is corrected at the aligning operation, so that an accuracy in alignment can be improved. In addition, the deflection is also corrected at the exposing operation, so that a pattern resolution can be also improved.

Furthermore, in the above MEMS product, both front and rear surfaces of the SOI substrate (thin plate shaped work) 51 are formed with various films, so that the deflection is caused to the SOI substrate 51 by stresses of the films. However, it is possible to correct the deflection caused by the above film stresses in addition to a deflection caused by the SOI substrate's own weight.

As described above, the method of manufacturing the above dynamic-quantitative sensor is one example of the method of manufacturing a structural body according to the present invention. The present invention is not limited to the above sequences of the manufacturing steps.

<Regarding Electronic Part using the Acceleration Sensor>

The above dynamic-quantitative sensor according to the present embodiment is assembled, for example, on a circuit board for mounting an active element such as IC or the like. A pad opening 67 (an electrode pad provided to a pad portion), an electronic substrate and the active element such as IC or the like are connected by materials used in a wire bonding method, a flip-chip connecting method or the like, so that the dynamic-quantitative sensor functions as one electronic part. Such the electronic part is mounted, for example, on a game machine, a mobile terminal such as cellular phone or the like, and the electronic part is commercially distributed to markets.

The invention claimed is:

1. An exposing method comprising the steps of:
    supporting a peripheral portion of a thin plate-shaped workpiece of which both front and rear surfaces are subjected to work is vacuum-sucking acting on a supporting portion formed as an annular projection of a work stage provided to an exposing apparatus;
    facing the thin plate-shaped workpiece vacuum-sucked on the supporting portion, closely to a photomask through an alignment gap;
    correcting a deflection of a thin plate-shaped workpiece, caused at a central portion of the thin plate-shaped workpiece vacuum-sucked on the supporting portion, by flowing fluid into a hollow portion formed by both an inner peripheral portion of the annular projection and an upper smooth plane surface formed at an inside of the annular projection;
    adjusting a position of the thin plate-shaped workpiece having a peripheral portion vacuum-sucked on the supporting portion and a position of the photomask so as to align the positions of both the workpiece and the photomask;
    stopping vacuum sucking and blasting the fluid to a peripheral surface of the thin plate-shaped workpiece work from the supporting portion side to thereby separate the thin plate-shaped workpiece from the supporting portion and closely contact the peripheral portion of the thin plate-shaped workpiece to the photomask, and introducing a pressure of the fluid higher than the pressure in an alignment operation to urge the central portion of the thin plate-shaped workpiece against the photomask to thereby correct deflection of the thin plate-shaped workpiece; and
    exposing the thin plate-shaped workpiece with light irradiated from upper side of the photomask.

2. A method of manufacturing a structure in which the structure is manufactured by using the thin plate-shaped workpiece which is exposed with light in accordance with the exposing method according to claim 1.

3. A work stage of an exposing apparatus, comprising:
    a supporting portion formed as an annular projection for supporting a peripheral portion of a thin plate-shaped workpiece of which both front and rear surfaces are subjected to work;
    a hollow portion formed by both an inner peripheral portion of the annular projection and a upper smooth plane surface formed at an inside of the annular projection;
    a vacuum sucking/fluid blasting device for sucking the peripheral portion of the thin plate-shaped workpiece at a time of an alignment operation and for blasting fluid to the peripheral portion of the thin plate-shaped workpiece after the alignment operation; and
    a deflection correcting device for correcting a deflection caused at a central portion of the thin plate-shaped workpiece by introducing a fluid into the hollow portion, the deflection correcting device comprising at least two fluid introducing systems each introducing the fluid having a different pressure to each other into the hollow portion, and opening/closing devices provided to the respective fluid introducing systems;
    the fluid introducing systems being configured such that i) a fluid pressure at a time of an alignment operation in which a position of a photomask is adjusted; and ii) a fluid is then blasted to a peripheral surface of the thin plate-shaped workpiece from the supporting portion side to thereby separate the thin plate-shaped workpiece from the supporting portion and closely contact the peripheral portion of the thin plate-shaped workpiece to the photomask; and iii) a fluid pressure, at a time of an exposing operation in which the central portion of the thin plate-shaped workpiece is closely contacted to the photomask, is set to be changeable by switching the opening/closing devices provided to the respective fluid introducing systems.

4. The work stage of the exposing apparatus according to claim 3, wherein the opening/closing devices are controlled by a control device so as to automatically switch the opening/closing devices.

5. The work stage of the exposing apparatus according to claim 3, wherein the work stage further comprises a base portion formed with an introducing hole for introducing the fluid into the hollow portion and a discharging hole for discharging the fluid to outside of the hollow portion.

* * * * *